US012689373B2

(12) United States Patent
Schuster et al.

(10) Patent No.: US 12,689,373 B2
(45) Date of Patent: Jul. 21, 2026

(54) UNIVERSAL FAST-FLUX CONTROL OF LOW-FREQUENCY QUBITS

(71) Applicant: The University of Chicago, Chicago, IL (US)

(72) Inventors: David I. Schuster, Chicago, IL (US); Helin Zhang, Chicago, IL (US)

(73) Assignee: The University of Chicago, Chicago, IL (US)

( * ) Notice: Subject to any disclaimer, the term of this patent is extended or adjusted under 35 U.S.C. 154(b) by 977 days.

(21) Appl. No.: 17/904,377

(22) PCT Filed: Feb. 17, 2021

(86) PCT No.: PCT/US2021/018428
§ 371 (c)(1),
(2) Date: Aug. 17, 2022

(87) PCT Pub. No.: WO2021/168019
PCT Pub. Date: Aug. 26, 2021

(65) Prior Publication Data
US 2023/0073224 A1 Mar. 9, 2023

Related U.S. Application Data

(60) Provisional application No. 62/978,017, filed on Feb. 18, 2020.

(51) Int. Cl.
*G06N 10/40* (2022.01)
*G06N 10/60* (2022.01)
(Continued)

(52) U.S. Cl.
CPC ............. *H03K 17/92* (2013.01); *G06N 10/40* (2022.01); *G06N 10/60* (2022.01); *G06N 10/70* (2022.01)

(58) Field of Classification Search
CPC ........ H03K 17/92; G06N 10/40; G06N 10/60; G06N 10/70
See application file for complete search history.

(56) References Cited

U.S. PATENT DOCUMENTS 9,530,873 B1    12/2016  Carroll et al.
2023/0010205 A1 *  1/2023  Sank ................. G01R 33/0358

OTHER PUBLICATIONS

Lin et al., Protecting a Superconducting Qubit from Energy Decay by Selection Rule Engineering, May 2017. (Year: 2017).*
(Continued)

*Primary Examiner* — Marshall L Werner
(74) *Attorney, Agent, or Firm* — Cozen O'Connor

(57) ABSTRACT

Methods for initializing a qubit into a pure state, reading the qubit, and arbitrarily rotating the qubit into any quantum state complete in times shorter than the qubit's typical dephasing and relaxation times. These methods provide universal single-qubit control and may be used to implement quantum gates with high fidelity. The methods may be implemented with superconducting qubits, such as heavy fluxonium, and do not rely on a three-dimensional cavity for suppressing spontaneous emission. Therefore, the methods may be implemented using smaller two-dimensional architectures commonly used for superconducting circuits. The methods also work with low-frequency qubits, i.e., qubits for which the energy spacing between the two quantum-computational states is less than the mean thermal energy of a surrounding bath. This reduces the cooling requirements of the qubit while maintaining fidelity.

17 Claims, 12 Drawing Sheets

(51) Int. Cl.
 G06N 10/70 (2022.01)
 H03K 17/92 (2006.01)

(56) References Cited

OTHER PUBLICATIONS

Nguyen et al., The High-Coherence Fluxonium Qubit, Oct. 2018. (Year: 2018).*

Zhu et al., Asymptotic Expressions for Charge-Matrix Elements of the Fluxonium Circuit, Apr. 2013. (Year: 2013).*

Lin et al., Demonstration of Protection of a Superconducting Qubit from Energy Decay, Apr. 2018. (Year: 2018).*

Earnest et al., Realization of a Lambda System with Metastable States of a Capacitively-Shunted Fluxonium, Apr. 2018. (Year: 2018).*

Baker et al., Adaptive Rotating-Wave Approximation for Driven Open Quantum System, Nov. 2018. (Year: 2018).*

Lin et al., Protecting A Superconducting Qubit from Energy Decay by Selection Rule Engineering, arXiv:1705.07873v1 [cond-mat. supr-com] May 22, 2017.

Earnest et al., Realization of a A System with Metastable States of a Capacitively-Shunted Fluxonium, arXiv:1707.00656v2 [quant-ph] Apr. 13, 2018.

Manucharyan et al., Fluxonium: Single Cooper Pair Circuit Free of Charge Offsets, arXiv:0906.0831v2 [cond-mats.mes-hall] Oct. 20, 2009.

Nguyen et al., High-Coherence Fluxonium Qubit, Physical Review X 9, 041041 (2019).

PCT Application No. PCT/US21/18428, International Search Report and Written Opinion, dated Jul. 19, 2021.

Kjaergaard et al., Superconducting Qubits: Current State of Play, arXiu:1905.13641v2 (quant-ph], Jul. 26, 2019.

J. Vool et al., Driving Forbidden Transitions in the Fluxonium Articial Atom, arXiv:1711.07508v2 [quant-ph] May 31, 2018.

* cited by examiner

UNIVERSAL FAST-FLUX CONTROL OF LOW-FREQUENCY QUBITS

RELATED APPLICATIONS

This application is a 35 U.S.C. § 371 filing of International Application No. PCT/US2021/018428, filed on Feb. 17, 2021, which claims priority to U.S. Provisional Patent Application No. 62/978,017, filed on Feb. 18, 2020. Each of these applications is incorporated herein by reference in its entirety.

STATEMENT REGARDING FEDERALLY SPONSORED RESEARCH OR DEVELOPMENT

This invention was made with government support under grant number W911NF1910016 awarded by the Army Research Office. The government has certain rights in the invention.

BACKGROUND

Superconducting circuits are among the most promising of qubit technologies for scalable quantum computation due to their long coherence times, high gate fidelities, and processor size (i.e., the number of qubits that can be manipulated simultaneously).

SUMMARY

Many prior-art superconducting quantum processors implement qubits as transmons, whose coherence times have improved by nearly an order of magnitude due to new methods that decrease the effects of environmental noise. One of the simplest of superconducting circuits, a transmon can be modeled as a weakly anharmonic oscillator whose energy states are joined via large transition dipole matrix elements. Transmons trade off decreased sensitivity to charge-induced-noise dephasing with increased sensitivity to decay.

Flux qubits, and in particular fluxonium, are promising types of superconducting circuits that offer many advantages over transmons. Some of the benefits of fluxonium include a rich energy-level structure, natural protection from charge-noise-induced relaxation and dephasing, and compatibility with circuit quantum electrodynamics (QED). Fluxonium is created by shunting a flux qubit with a large inductance. Further shunting of the qubit with a large capacitance results in "heavy fluxonium", which advantageously increases relaxation times. However, a challenge with using flux qubits in large-scale superconducting processors is that standard microwave control techniques result in slow gates that cannot complete before dephasing and relaxation take effect.

The present embodiments include fast methods for controlling superconducting qubits, and therefore may be used with superconducting quantum computers (e.g., those based on fluxonium qubits). Here, "fast" means that the methods complete in times much shorter than typical dephasing and relaxation times, and thus high fidelities (e.g., 99%) can be reliably achieved. Advantageously, these methods do not rely on a three-dimensional (3D) cavity for suppressing spontaneous emission, and therefore can be implemented using smaller two-dimensional (2D) architectures commonly used for superconducting circuits. The present embodiments include methods for initializing a superconducting qubit into a pure state (e.g., at the beginning of a quantum gate) and methods for reading-out the quantum state of the superconducting qubit (e.g., at the end of the quantum gate). Finally, the present embodiments also include methods based on fast pulses for arbitrarily rotating a single superconducting qubit into any quantum state, thereby providing universal single-qubit control.

Advantageously, the present embodiments can work when the energy spacing between the two quantum-computational states of the qubit is less than the equivalent mean thermal energy of a surrounding bath. Prior-art superconducting qubits are challenged by small energy spacings because the resulting thermal occupation of both quantum-computational states reduces fidelity. By overcoming the limitations of this thermal occupation, the present embodiments relieve the requirements for cryogenic cooling (i.e., the qubit does not need to be cooled to temperatures as low as those used in the prior art, while maintaining fidelity).

For clarity in the following discussion, examples are described with respect to fluxonium qubits. However, it should be appreciated that the present embodiments may be used with any kind of flux qubit, i.e., a "heavy" flux qubit, a "light" flux qubit, or any other type of qubit whose properties are controllable with an applied magnetic flux. Furthermore, the present embodiments may also be used with another type of qubit without departing from the scope hereof. For example, the present embodiments can be implemented with a charge qubit (e.g., a cooper pair box). The present embodiments can also be implemented with a qubit containing a voltage-controllable Josephson junction (e.g., a gatemon qubit, or flux-like qubits where the Josephson junction is voltage-controlled).

BRIEF DESCRIPTION OF THE FIGURES

FIG. 7C also shows the potential well, the first six energy eigenstates, and dashed lines representing the wavefunctions for the first four levels.

3 photon decay along $|e1\rangle \rightarrow |e0\rangle$ provides a directional transition that completes the reset. An $|e0\rangle \rightarrow |f0\rangle$ $\pi$ pulse is applied before the readout to boost the output signal.

Figures 8A, 8B:
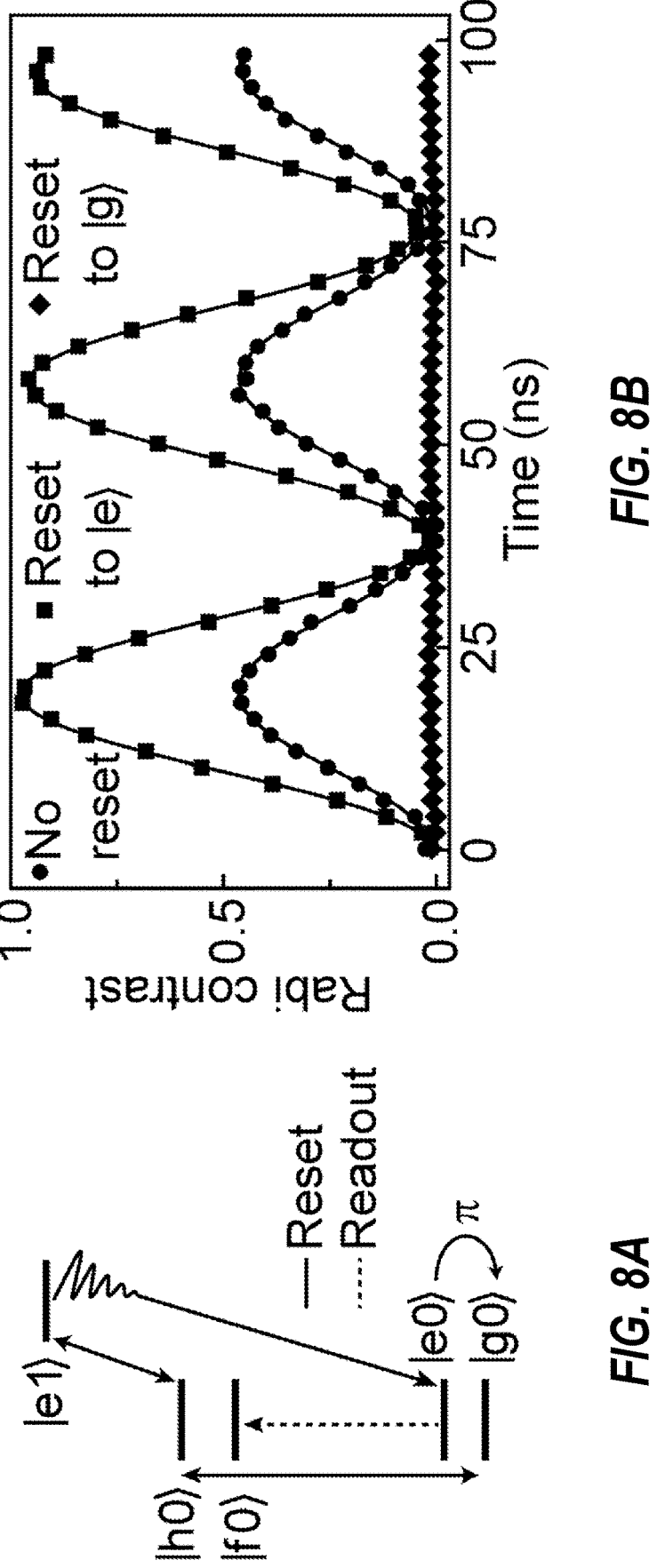
FIG. 8A shows a level diagram for reset and readout protocols, in embodiments. Reset is performed by simultaneously driving both $|g0\rangle \rightarrow |h0\rangle$ and $|h0\rangle \rightarrow |e1\rangle$ transitions, as indicated by the double-headed arrows. The spontaneous

FIG. 8B shows Rabi oscillations between $|e\rangle$ and $|f\rangle$ for different initial state preparations. Squares indicate data points for which the initial state was prepared in $|e\rangle$ before the $|e\rangle \leftrightarrow |f\rangle$ Rabi flopping. Circles indicate data points for which the initial state was in the thermal equilibrium state. Diamonds indicate data points for which the initial state was $|e\rangle$.

Figure 9A:
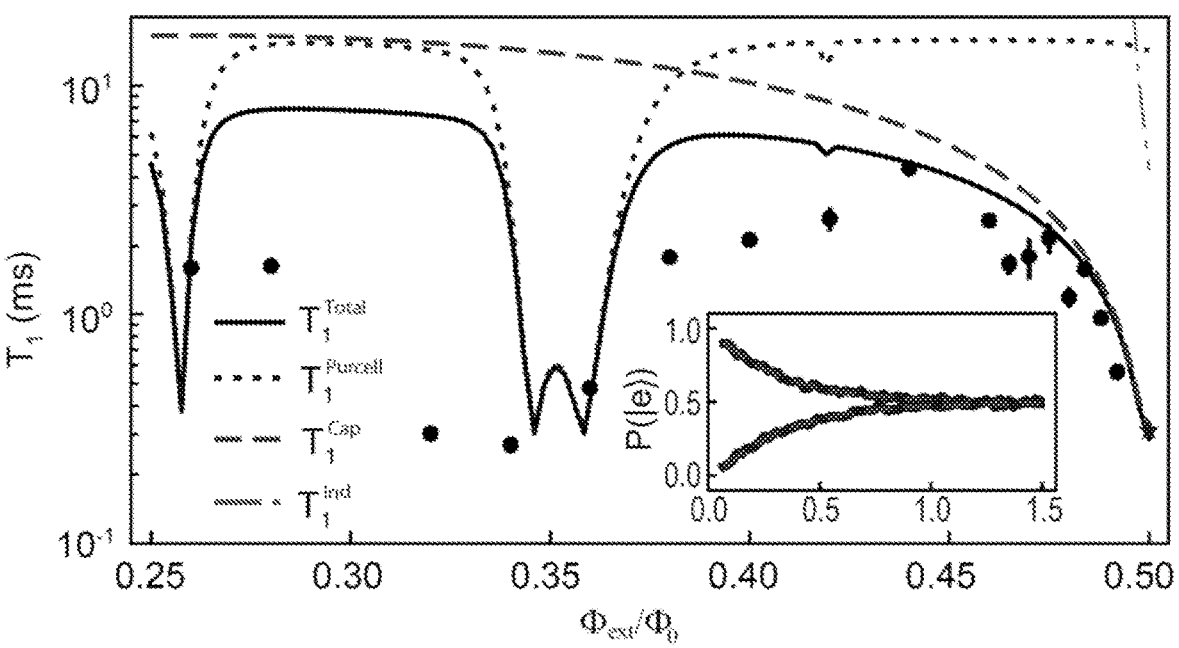

FIG. 9A is a plot of energy relaxation time ($T_1$) as a function of flux, along with the theoretical limits set by dielectric $$(T_1^{Cap}),$$

inductive $$(T_1^{Ind}),$$

Purcell $$(T_1^{Purcell}),$$

and the combined loss $$(T_1^{Total}).$$

The inset shows the decay of $P(|e\rangle)$ to 0.495 after preparing the qubit in $|g\rangle$, $|e\rangle$ at the flux-frustration point.

Figure 9B:
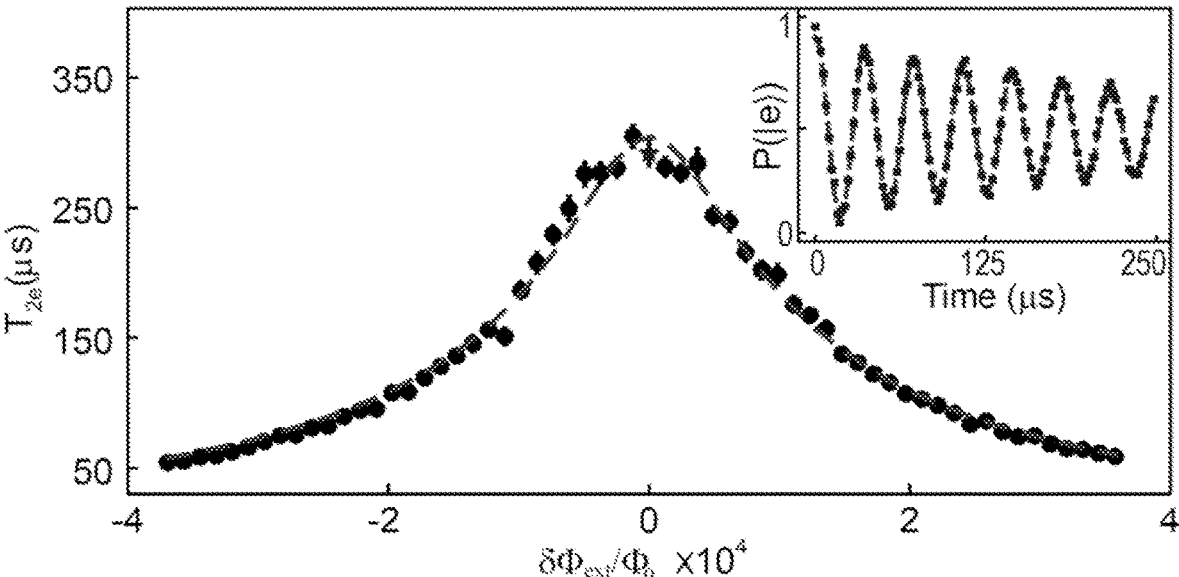

FIG. 9B is a plot of echo decay time $T_{2e}$ as a function of flux near the flux-frustration point. The inset shows an echo measurement at the flux-frustration point.

Figure 10A:
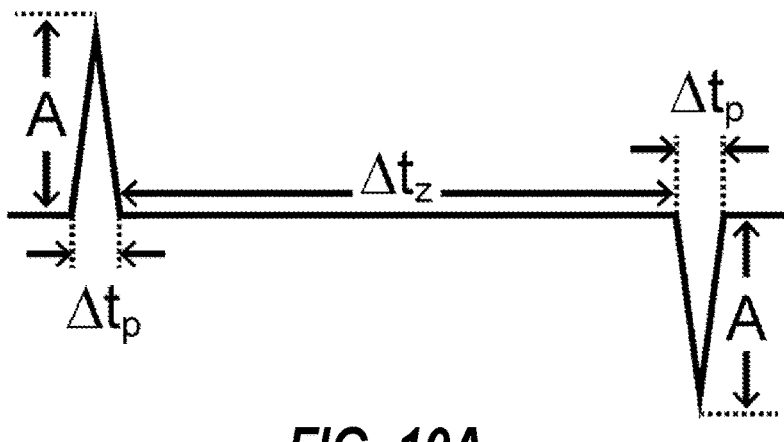

FIG. 10A shows a generic pulse scheme, in an embodiment. We use net-zero flux pulses for our native gates (Y/2 and Y). They are constructed using three sections, a positive triangular pulse with amplitude A and width $\Delta t_p$ on the fast-flux line, an idling period of $\Delta t_z$ and finally another triangular pulse identical to the first one but with a negative amplitude.

Figure 10B:
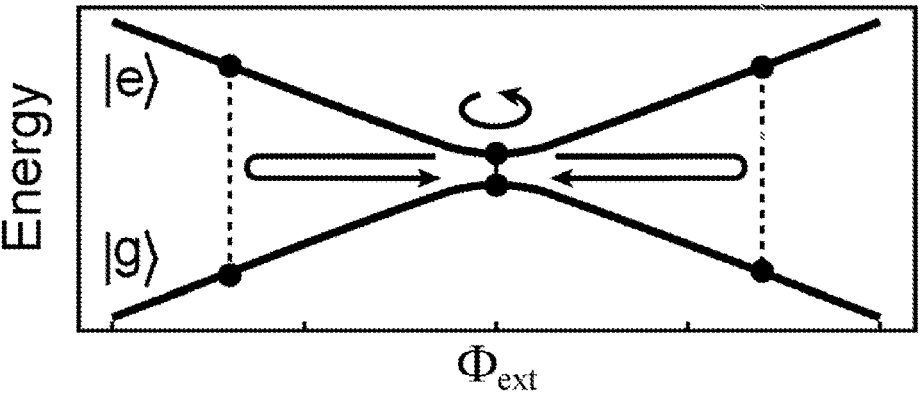

FIG. 10B shows energy levels of the computational space as a function of external flux ($\Phi_{ext}$) showing how the fast-flux pulse changes the energies of the instantaneous eigenstates.

Figure 10C:
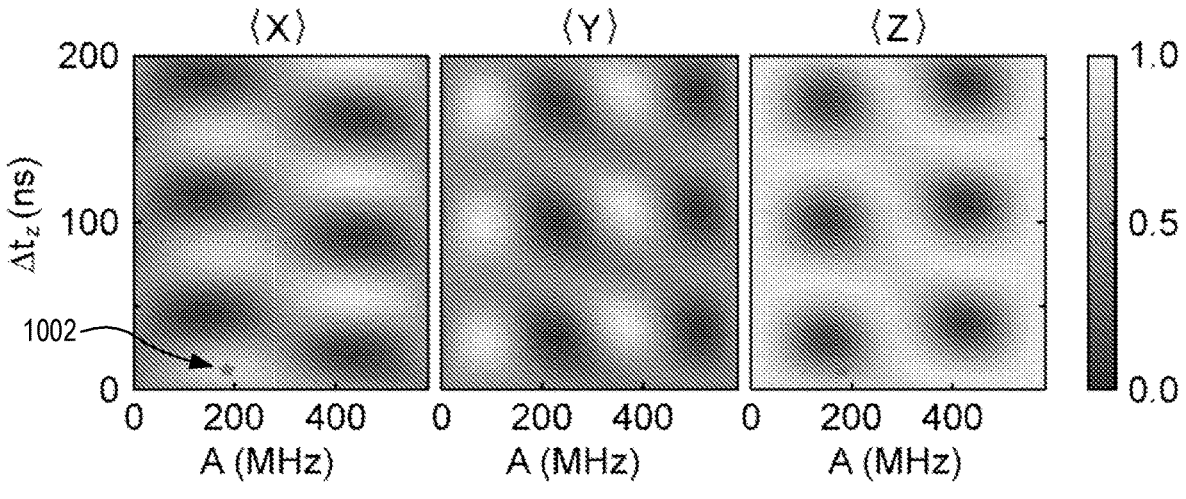

FIG. 10C shows expectation values of $\sigma_x$, $\sigma_y$, and $\sigma_z$ as a function of pulse parameters $\Delta t_z$ and A. These 2D sweeps are used to determine the optimal parameter for the Y/2 and Y gates. In FIG. 10C, the star ★ indicates the parameters for a Y/2 gate.

Figure 10D:
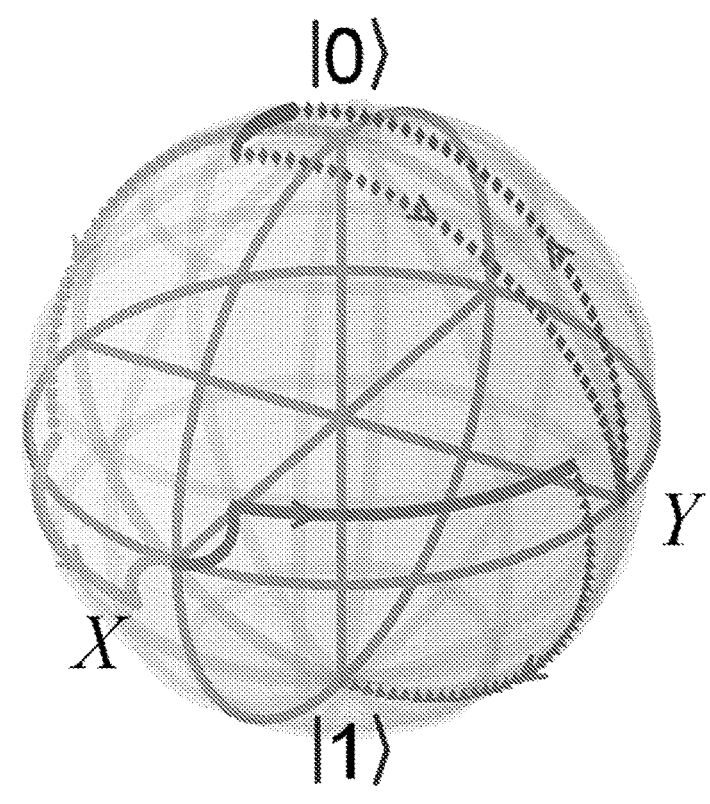

FIG. 10D shows trajectories of three distinct initial states $|0\rangle$, $(|0\rangle+|1\rangle)/\sqrt{2}$ and $(|0\rangle+i|1\rangle)/\sqrt{2}$ on the Bloch sphere when a Y/2 gate is applied.

Figure 10E:
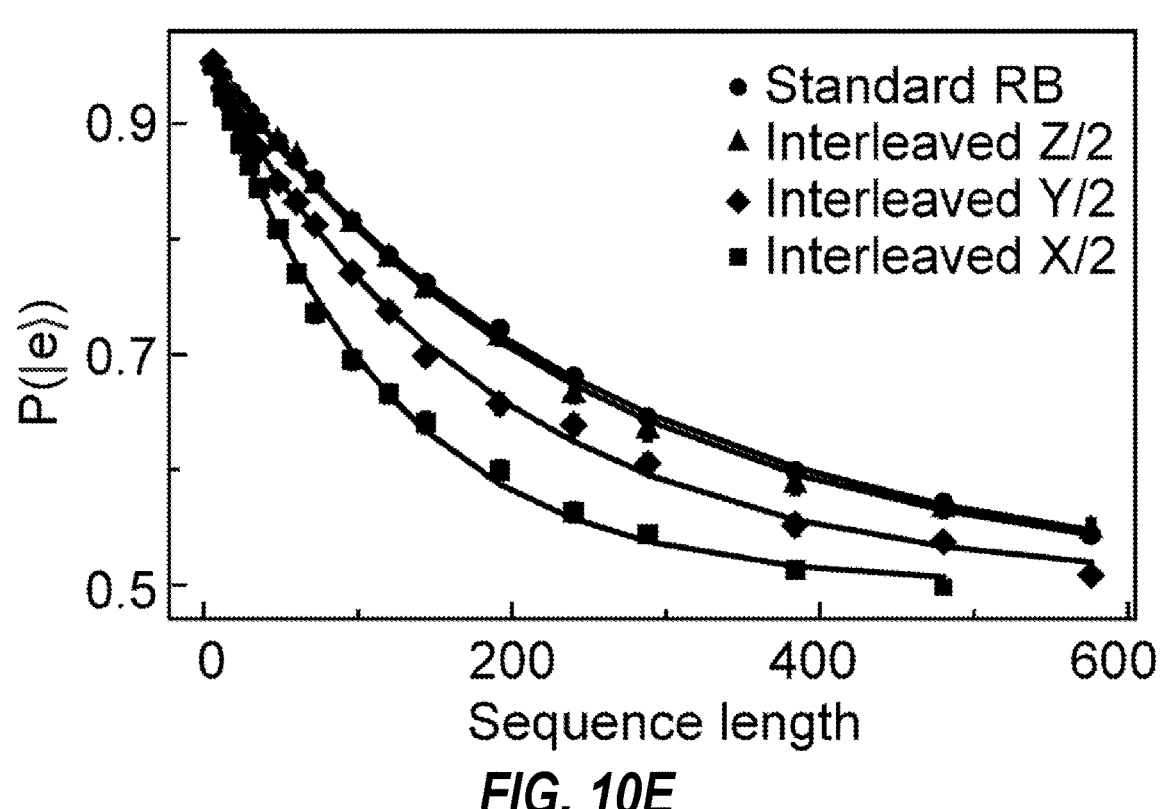

FIG. 10E is a plot comparing standard randomized benchmarking (RB, circles) and interleaved RB for Z/2 (triangles), Y/2 (diamonds) and X/2 (squares) gates. FIG. 10E was generated from 75 randomized gate sequences averaged over 10,000 times. The average gate fidelity is $\mathcal{F}_{avg}$=0.9980 and the individual gate fidelities are $\mathcal{F}_{Z/2}$=0.9999,

4

$\mathcal{F}_{Y/2}$=0.9992 and $\mathcal{F}_{X/2}$=0.9976. The uncertainties in all fidelities are smaller than the least significant digit.

Figure 11:
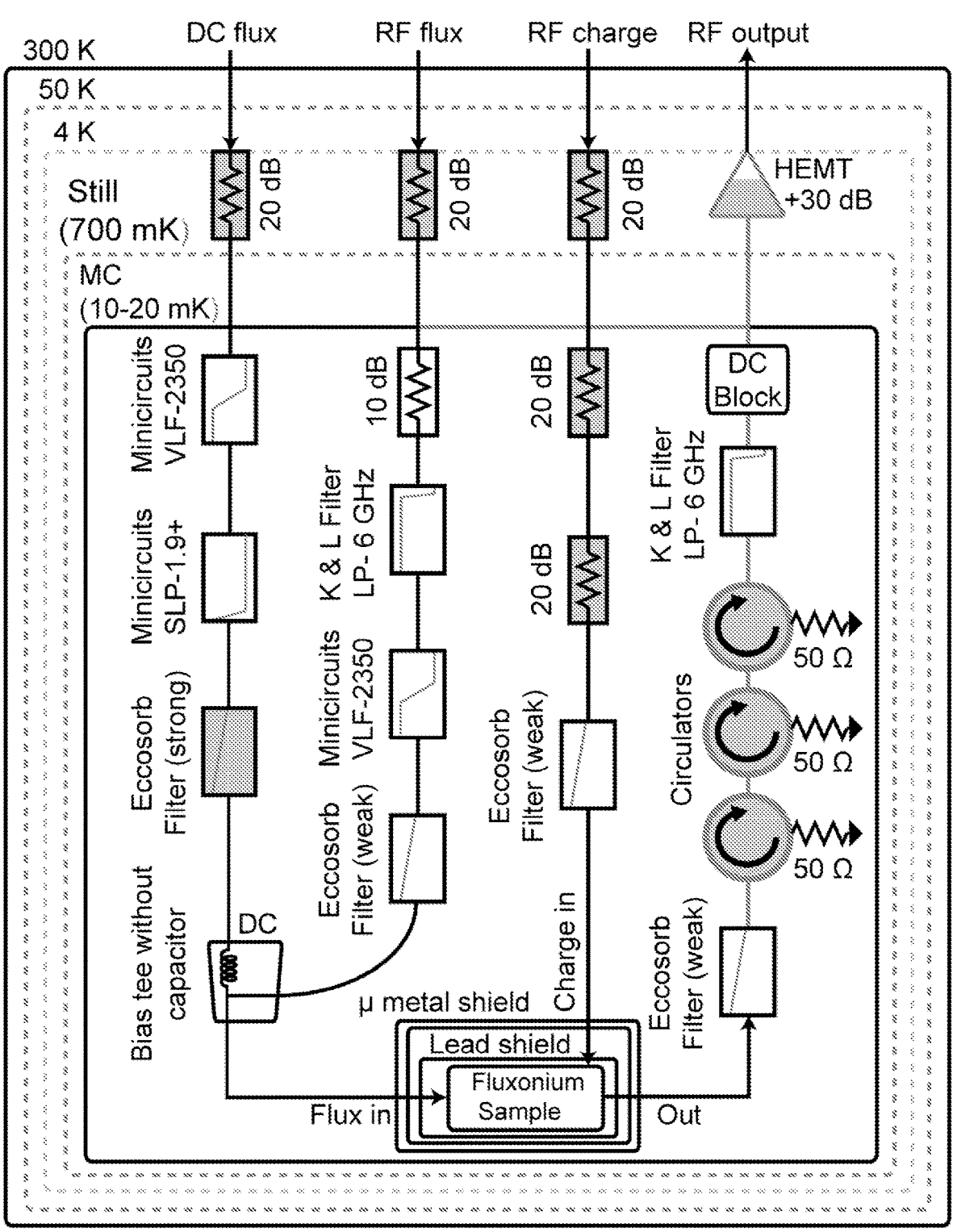

FIG. 11 is a wiring diagram inside the dilution refrigerator. Outside the dilution fridge, there are ~16 dB of attenuation and a DC block on the RF flux line, and an ultra-low pass (~1 Hz) RC filter on the DC flux line. The total attenuation on the RF flux line proved important for both the $T_1$ and $T_2$ of the qubit, likely due to reduction in noise from the arbitrary waveform generator (Agilent 81180A).

Figure 12:
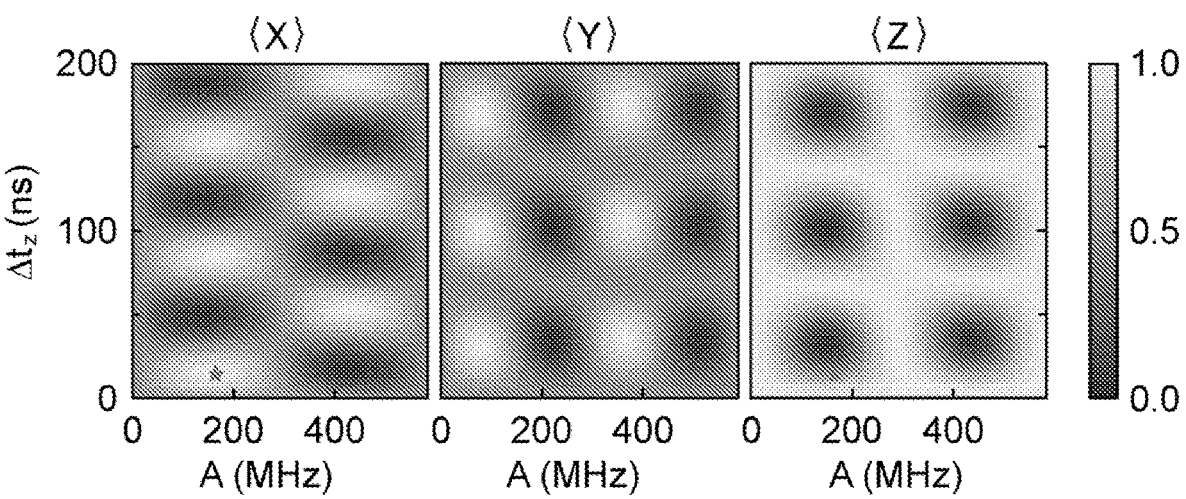

FIG. 12 shows simulated expectation values of $\sigma_x$, $\sigma_y$ and $\sigma_z$ as a function of pulse parameters $\Delta t_z$ and A with $\Delta t_p$=4.76 ns. The simulation shows good agreement with the experimental data shown in FIG. 4C.

Figure 13:
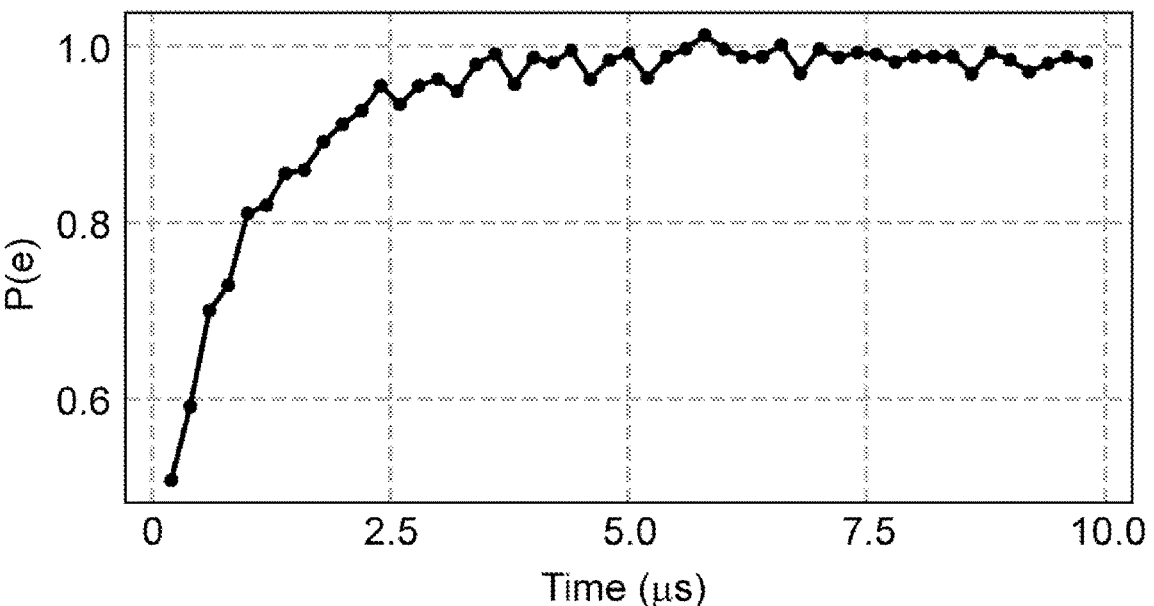

FIG. 13 shows the population in the $|e\rangle$ state as a function of the length of the reset pulse. The population was measured after simultaneously driving $|g0\rangle \rightarrow |h0\rangle$ and $|h0\rangle \rightarrow |e1\rangle$ transitions for different lengths of time. Reset of the state was achieved in ~5 μs.

Figures 14A, 14B:
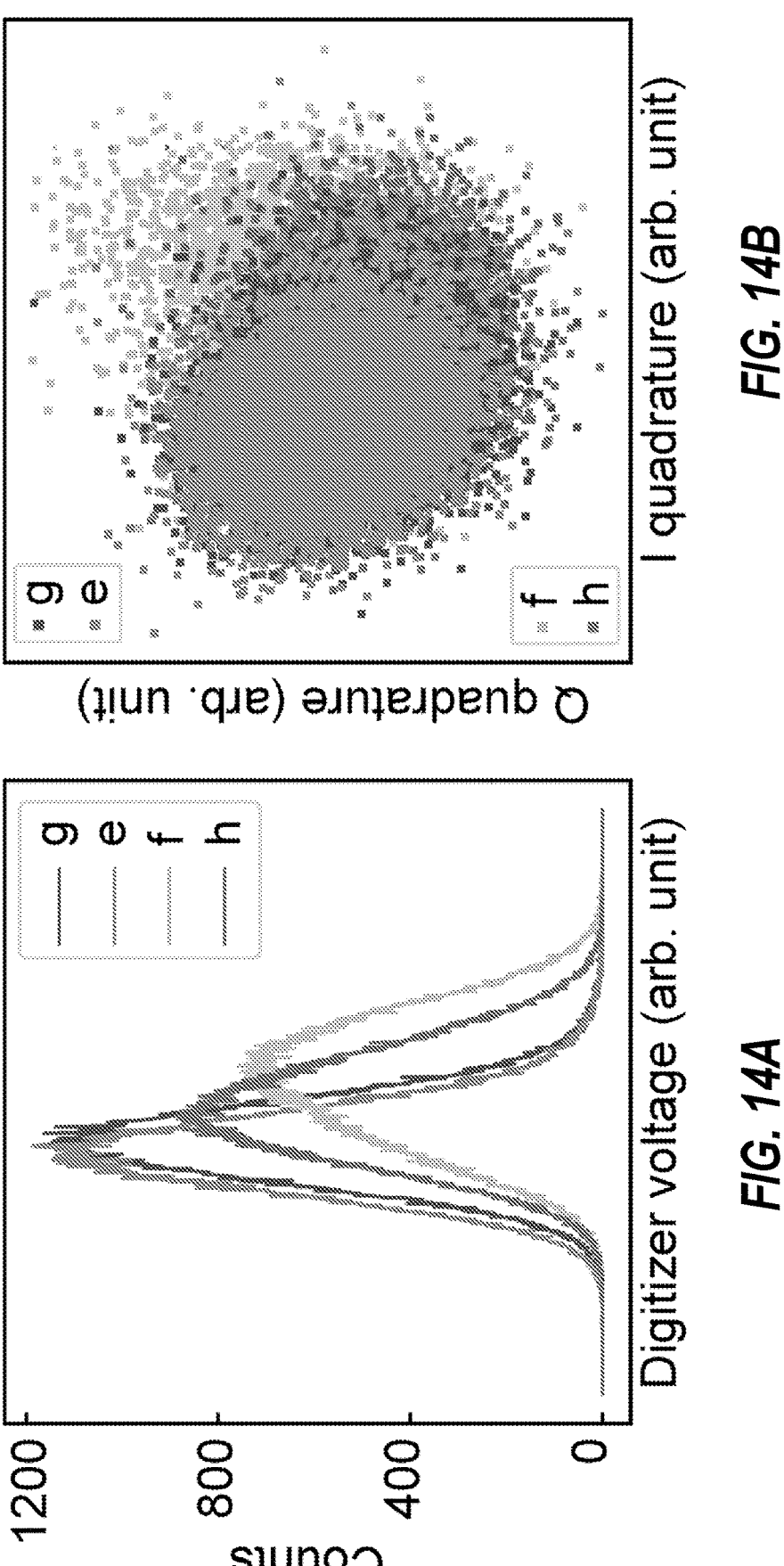

FIG. 14A is histogram of the lowest four fluxonium states $|g\rangle$, $|e\rangle$, $|f\rangle$, and $|h\rangle$. The $|g\rangle$-$|f\rangle$ readout fidelity is ~50%.

FIG. 14B shows the distribution of all single shot data from the lowest four fluxonium states on the IQ plane.

DETAILED DESCRIPTION

Figure 1:
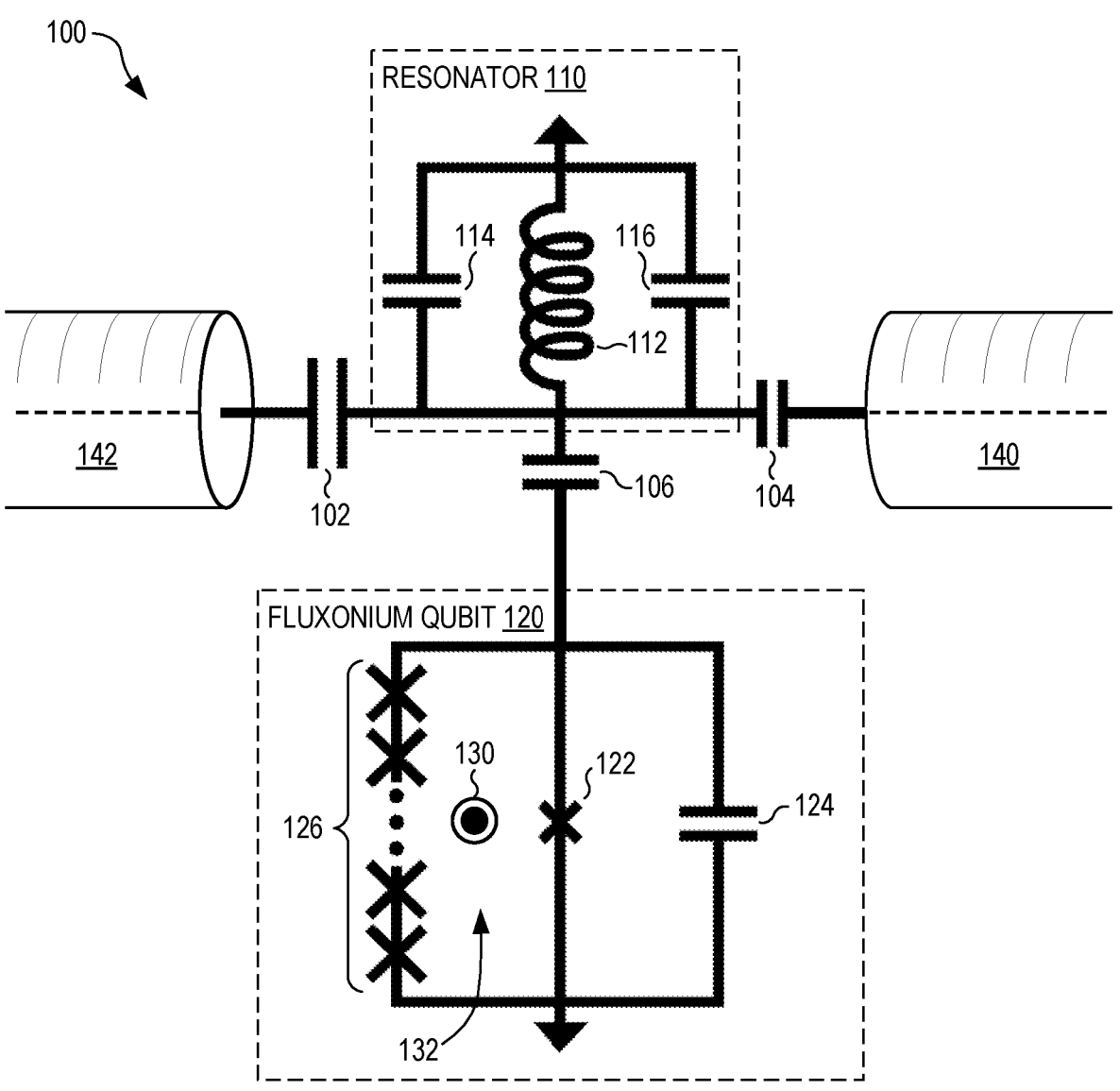
FIG. 1 is a schematic diagram of a quantum system in which a fluxonium qubit is capacitively coupled to a readout resonator, in an embodiment.

FIG. 1 is a schematic diagram of a quantum system 100 in which a fluxonium qubit 120 is coupled, via a coupling capacitor 106, to a readout resonator 110. The fluxonium qubit 120 is an example of heavy fluxonium in which a small-area Josephson junction 122 with inductance $L_J$ is shunted by a capacitor 124 with capacitance $C_q$. The fluxonium qubit 120 also includes a superinductor 126 formed from an array of large-area Josephson junctions that shunts the Josephson junction 122 with an inductance $L_{JA}$. The superinductor 126 has a total Josephson energy $E_{JA}$ that is much larger than a total charging energy $E_{CA}$ of the superinductor 126 (i.e., $E_{JA} \gg E_{CA}$) to ensure that charge dispersion for each junction of the superinductor 126 is small, and thus that the superinductor 126 serves only as an inductor.

A Hamiltonian $H_f$ for the fluxonium qubit 120 is $$H_f = -4E_C \frac{d^2}{d\varphi^2} - E_J \cos\left(\varphi - 2\pi \frac{\Phi_{ext}}{\Phi_0}\right) + \frac{1}{2}E_L\varphi^2, \tag{1}$$

where $\varphi$ is the phase across the Josephson junction 122, $E_C$=$e^2$/(2$C_q$) is the charging energy of the capacitor 124 (e being the charge of the electron), $$E_J = \Phi_0^2/(2L_J)$$

is the Josephson energy of the Josephson junction 122, $$E_L = \Phi_0^2/(2L_{JA})$$

is the inductive energy of the superinductor 126, $\Phi_{ext}$ is external magnetic flux 130 threading a loop 132 formed by the superinductor 126 and the Josephson junction 122, and $\Phi$=h/(2e) is the superconducting magnetic flux quantum (h being Planck's constant).

The readout resonator 110 is represented in FIG. 1 as a readout inductor 112 that resonates with first and second readout capacitors 114 and 116. An inductance $L_R$ of the readout inductor 112, and a parallel capacitance $C_R$ of the readout capacitors 114, 116, are selected such that the readout resonator 110 has a resonant frequency that is high compared to a temperature of an environment in which the quantum system 100 is located and operates. For example, the quantum system 100 may be mounted inside of a cryostat that cools the quantum system 100 to a temperature less than 50 mK. At 10 mK, the peak of the blackbody spectrum occurs near 600 MHz (as estimated using Wien's displacement law). Accordingly, the resonant frequency of the readout resonator 110 should be made higher than this value (e.g., 5 GHz, or more) to minimize excitation of the readout resonator 110 by thermal background photons. At temperatures less than 10 mK, the resonant frequency of the readout resonator 110 may be reduced accordingly.

To measure a state of the fluxonium qubit 120, the readout resonator 110 may be probed (e.g., via two-tone spectroscopy) using a first microwave transmission line 140 coupled to the readout resonator 110 via an input capacitor 104, and with a second microwave transmission line 142 coupled to the readout resonator 110 via an output capacitor 102. Each of the microwave transmission lines 140 and 142 may be a coaxial transmission line, or a planar transmission line (e.g., microstrip) co-fabricated with the quantum system 100 on a common substrate. The quantum system 100 may be alternatively or additionally coupled to one or more other superconducting quantum components (e.g., one or more additional resonators 110, one or more additional fluxonium qubits 120, one or more other additional superconducting qubits of another type, etc.).

Figure 2:
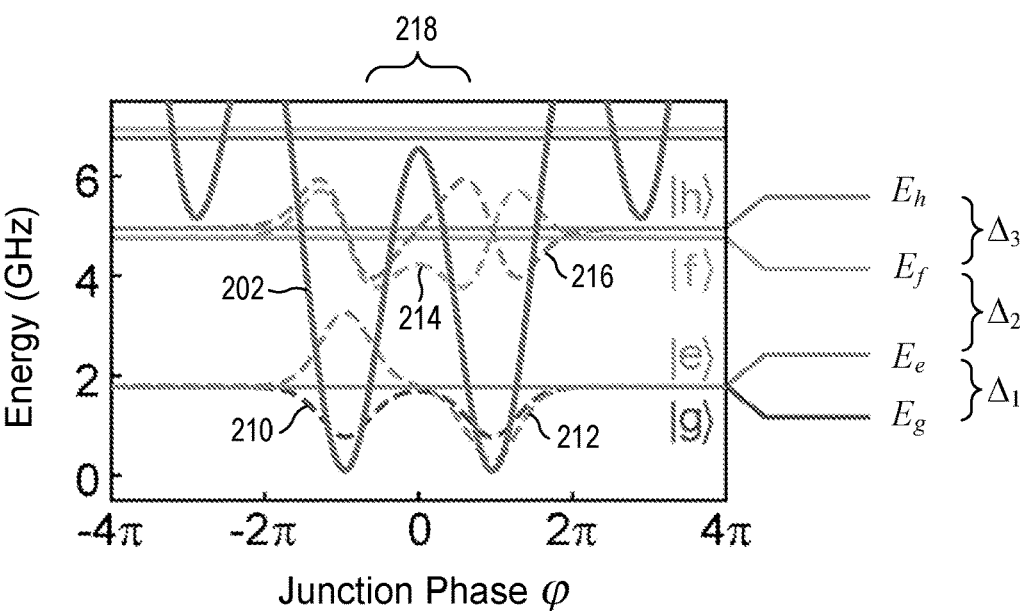
FIG. 2 is a plot showing potential energy and wavefunctions of the fluxonium qubit of FIG. 1 as a function of junction phase.

FIG. 2 is a plot showing potential energy 202 and wavefunctions 210, 212, 214, and 216 of the fluxonium qubit 120 as a function of the junction phase φ, when the loop 132 is threaded with externally generated magnetic flux 130 equal to one-half of the superconducting magnetic flux quantum (i.e., $\varphi_{ext}=\varphi_0/2$, also referred to as the "flux-frustration point"). The potential energy 202, corresponding to the second and third terms on the right-hand side of Eqn. 1, exhibit a pair of potential-energy wells near ±π. The fluxonium qubit 120 has a ground state $|g\rangle$ with a ground-state wavefunction 210 and a ground-state energy $E_g$, a first excited state $|e\rangle$ with a first excited-state wavefunction 212 and a first excited-state energy $E_e$, a second excited state $|f\rangle$ with a second excited-state wavefunction 214 and a second excited-state energy $E_f$, and a third excited state $|h\rangle$ with a third excited-state wavefunction 216 and a third excited-state energy $E_h$. Each of the states $|g\rangle$, $|e\rangle$, $|f\rangle$, and $|h\rangle$ is an energy eigenstate of the Hamiltonian $H_f$ of Eqn. 1.

Quantum computation with the fluxonium qubit 120 may be implemented with the ground state $|g\rangle$ and the first excited state $|e\rangle$. These states are also referred to herein as the quantum-computational states $|g\rangle$ and $|e\rangle$. Tunneling through a center peak 218 of the potential energy 202 removes a degeneracy between these two states, resulting in an energy spacing $\Delta_1=E_e-E_g$. In the example of FIG. 2, $\Delta_1$ is only 14 MHz, much less than the frequency of the environmental temperature. To achieve such a small value for $\Delta_1$ (i.e., weak tunneling through the center peak 218), the height of the center peak 218 can be made large by selecting the ratio $E_J/E_C$ to be greater than one. In the example of FIG. 2, $E_J/E_C \approx 7$. However, the fluxonium qubit 120 can be configured with a ratio $E_J/E_C$ that is even larger, wherein $\Delta_1$ decreases accordingly. Alternatively, the fluxonium qubit 120 can be configured with a smaller ratio $E_J/E_C$ without departing from the scope hereof. Alternatively, the fluxonium qubit 120 can be configured with an additional Josephson junction that allows $E_J/E_C$ to be electronically controlled.

Associated with small values of $\Delta_1$ is a suppression of transitions between the states $|g\rangle$ and $|e\rangle$. That is, the transition dipole between the states $|g\rangle$ and $|e\rangle$ is nearly zero. Accordingly, the first excited state $|e\rangle$ is metastable, which can be seen in FIG. 1 by the fact that the overlap of the wavefunctions 210 and 212, when integrated over all values of φ, is small. Transitions between $|e\rangle$ and $|g\rangle$ are fluxon-like inter-well transitions. Accordingly, the first excited state $|e\rangle$ is also referred to herein as the metastable fluxon state $|e\rangle$.

Each of the two potential-energy wells in FIG. 2 is deep enough to support an additional eigenstate, shown in FIG. 2 as the second and third excited states $|f\rangle$ and $|h\rangle$. Transitions between the ground state $|g\rangle$ and the third excited state $|h\rangle$ are intra-well transitions that are plasmon-like. Transitions between the first excited state $|e\rangle$ and the second excited state $|f\rangle$ are also plasmon-like. Unlike the suppressed fluxon transitions between the states $|g\rangle$ and $|e\rangle$, each of these plasmon-like transitions is strong, and thus can be readily driven via applied microwave fields. As shown in FIG. 2, an energy spacing $\Delta_2=E_f-E_e$ between the second excited state $|f\rangle$ and the first excited state $|e\rangle$ is larger than $\Delta_1$. Similarly, an energy spacing $\Delta_3 \times E_h-E_f$ between the third excited state $|h\rangle$ and the second excited state $|f\rangle$ is greater than $\Delta_1$ due to the increasing tunneling between these states near the top of the center peak 218. Nevertheless, $\Delta_3$ is still less than $\Delta_2$. In the example of FIG. 2, $\Delta_2$ is 2974 MHz and $\Delta_3$ is 194 MHz. Accordingly, the second excited state $|f\rangle$ is also referred to herein as the first plasmon excited state $|f\rangle$, and the third excited state $|h\rangle$ is also referred to herein as the second plasmon excited state $|h\rangle$.

Figure 3:
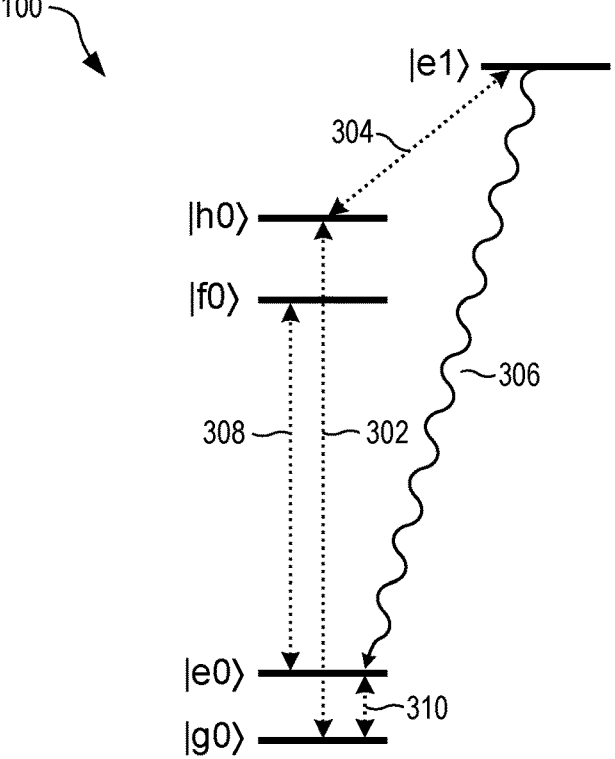
FIG. 3 is an energy-level diagram of the quantum system of FIG. 1, in an embodiment.

FIG. 3 is an energy-level diagram of the quantum system 100 of FIG. 1. In FIG. 3, each energy eigenstate of the quantum system 100 is a composite (i.e., tensor product) of one of the energy eigenstates of the fluxonium qubit 120 (i.e., one of the states $|g\rangle$, $|e\rangle$, $|f\rangle$, and $|h\rangle$) and a quantum state of the resonator 110 characterized by a number of photons in the resonator 110. Accordingly, FIG. 3 shows a composite state $|g0\rangle$ in which the fluxonium qubit 120 is in the ground state $|g\rangle$ and there are no photons in the resonator 110. Similarly, FIG. 3 shows a composite state $|e0\rangle$ in which the fluxonium qubit 120 is in the first excited state $|e\rangle$ and there are no photons in the resonator 110. FIG. 3 also shows composite states $|f0\rangle$ and $|h0\rangle$, which may be interpreted similarly.

FIG. 3 also shows a composite state $|e1\rangle$ in which the fluxonium qubit 120 is in the first excited state $|e\rangle$ and there is one photon in the resonator 110. The resonator 110 has a relatively low Q (e.g., less than 1000) and thus, when the quantum system 100 is in the state $|e1\rangle$, the resonator 110 will rapidly decay, emitting a spontaneous photon 306 that leaves the quantum system 100 in the state $|e0\rangle$. Note that the quantum system 100, when in the state $|e1\rangle$, is highly unlikely to decay to the state $|g0\rangle$ since such a decay involves a fluxon-like transition for the fluxonium qubit 120. As described above, such fluxon-like transitions are highly suppressed.

While FIG. 1 shows the fluxonium qubit 120 coupled to the readout resonator 110, the fluxonium qubit 120 may be alternatively coupled to another type of energy-dissipating device that couples the energy of the spontaneous photon 306 into a surrounding cold bath to reduce the entropy of the fluxonium qubit 120. Other examples of such energy dissipaters include 3D microwave cavities and microwave transmission lines.

FIG. 3 also illustrates a reset method for initializing the quantum system 100 into a pure state. Since the quantum system 100 resides in an environment whose temperature is large compared to $\Delta_1$, yet smaller than $\Delta_2$, the fluxonium qubit 120, when thermally equilibrated with environment, will be in a nearly evenly mixed state (i.e., a nearly even statistical ensemble of the pure states $|g\rangle$ and $|e\rangle$). Advantageously, the reset method described here transfers the fluxonium qubit 120 from the mixed state into a pure state (i.e., either one of the states $|g\rangle$ and $|e\rangle$) that can be subsequently controlled to prepare the fluxonium qubit 120, with high fidelity, in whatever state is needed (as based on the quantum algorithm or gate at hand). Thus, the reset method may be used as a first step for universal single-qubit control.

The initial mixed state of the fluxonium qubit 120 can be described as an ensemble whose density matrix operator has the form $\rho = p_g |g\rangle\langle g| + p_e |e\rangle\langle e|$, where $p_g$ is the fraction of the ensemble in the state $|g\rangle$ and $p_e$ is the fraction of the ensemble in the state $|e\rangle$. Thus, the operator $\rho$ has a g-term and an e-term. As shown in FIG. 3, the quantum system 100 may be driven with a first microwave field 302 that couples the states $|g0\rangle$ and $|h0\rangle$. For example, a frequency of the first microwave field 302 may be selected to be resonant with the transition between the states $|g0\rangle$ and $|h0\rangle$. The first microwave field 302 excites the fraction $p_g$ of the ensemble in the state $|g\rangle$ to the state $|h\rangle$, while leaving the fraction $p_e$ of the ensemble in the state $|e\rangle$ undisturbed.

Also shown in FIG. 3, the quantum system 100 may also be driven with a second microwave field 304 that couples the states $|h0\rangle$ and $|e1\rangle$. For example, a frequency of the first microwave field 302 may be selected to be resonant with the transition between the states $|h0\rangle$ and $|e1\rangle$. The microwave fields 302 and 304 may be applied simultaneously. The second microwave field 304 excites the fraction $p_g$ of the ensemble previously transferred to the state $|h0\rangle$ up to the state $|e1\rangle$. Once excited, the fraction rapidly decays into the $|e0\rangle$ state by emitting the spontaneous photon 306. After the decay, all the ensemble is in the $|e\rangle$ state of the fluxonium qubit 120, and thus the quantum system 100 is in a pure state. A third microwave field 310 may be subsequently applied to transfer the quantum system 100 into the pure state $|g0\rangle$. For example, the third microwave field 310 may be a $\pi$ pulse that coherently transfers the quantum system 100 from the pure state $|e0\rangle$ into the pure state $|g0\rangle$.

A first speed with which the first microwave field 302 excites the fraction $p_g$ from the state $|g0\rangle$ to the state $|h0\rangle$ depends on a first Rabi frequency that is equal to the product of an amplitude of the first microwave field 302 and a transition dipole moment between the states $|g0\rangle$ and $|h0\rangle$. Similarly, a second speed with which the second microwave field 304 excites the fraction $p_g$ from the state $|h0\rangle$ to the state $|e1\rangle$ depends on a second Rabi frequency that is equal to the product of an amplitude of the second microwave field 304 and a transition dipole moment between the states $|h0\rangle$ and $|e1\rangle$. Thus, the amplitudes of the microwave field 302, 304 may be chosen such that the fraction $p_g$ is excited to the state $|e1\rangle$, and subsequently decays to the state $|e0\rangle$, in a time that is short compared to both a relaxation time $T_1$ and a dephasing time $T_2$ of the fluxonium qubit 120 (see experimental demonstration below). By contrast, the reset method was experimentally demonstrated by applying the microwave fields 302 and 304 to the fluxonium qubit 120 for 15 μs, followed by a 10 μs waiting period (i.e., in the absence of the microwave fields 302 and 304) to allow the spontaneous photon 306 to be emitted. A $\pi$ pulse was the applied, after which a fidelity of 99% was obtained (i.e., 99% of the ensemble was in the state $|g0\rangle$, with the remaining 1% of the ensemble in other states). The corresponding temperature of the fluxonium qubit 120 was only 0.145 mK, lower than the ambient temperature by a factor of 100. Since it is experimentally challenging to produce a perfectly pure state, the reset method is described herein as generating an "approximately" pure state.

It is assumed in the previous discussion that the loop 132 of the fluxonium qubit 120 is continuously threaded by the external magnetic flux 130 during the entire reset method (and subsequent $\pi$ pulse, if included), as the external magnetic flux 130 is needed to generate the energy-level structure shown in FIG. 3. While the above discussion describes the reset method with respect to the fluxonium qubit 120, those trained in the art will recognize that the reset method can be applied to another type of qubit, provided that the qubit has, or includes, a similar energy-level structure to that shown in FIG. 3. Thus, the reset method is not limited to fluxonium qubits, but may be used with other types of flux qubits, other types of superconducting-circuit qubits (e.g., phase qubits), and even non-superconducting-circuit qubits (e.g., ions, atoms, nitrogen-vacancy centers, etc.). In some of these other types of qubits, one or more of the microwave fields 302, 304, and 308 may need to be replaced with an oscillating electromagnetic field in a different part of the electromagnetic spectrum (e.g., infrared, visible, ultraviolet, etc.).

FIG. 3 also illustrates a readout method for distinguishing between the quantum-computational states $|g\rangle$ and $|e\rangle$ of the fluxonium qubit 120. The fluxonium qubit 120, when coupled with the readout resonator 110, dispersively shifts the resonant frequency of the readout resonator 110 by an amount that depends on the state (i.e., $|g\rangle$ or $|e\rangle$) of the fluxonium qubit 120. Thus, the fluxonium qubit 120 induces, in the readout resonator 110, a first dispersive frequency shift when in the $|g\rangle$ state, and a second dispersive frequency shift when in the $|e\rangle$ state. A differential shift, equal to the different between the first and second dispersive frequency shifts, increases as the energies of the states $|g\rangle$ and $|e\rangle$ approach that of the excited resonator 110 (i.e., as the energies of the states $|g0\rangle$ and $|e0\rangle$ increase toward the energy of the state $|e1\rangle$).

For the quantum system 100, the energy gap between each of the lower-energy states $|g0\rangle$ and $|e0\rangle$, and the excited state $|e1\rangle$ is so large that the differential shift is too small to discern between the states $|g0\rangle$ and $|e0\rangle$. To enhance the interaction with the readout resonator 110, a $\pi$ pulse 308 may be applied between the states $|e0\rangle$ and $|f0\rangle$, as part of the readout method, to coherently transfer the population of the state $|e0\rangle$ into the state $|f0\rangle$. The goal of discerning between the states $|g0\rangle$ and $|e0\rangle$ is now implemented by discerning between the states $|g0\rangle$ and $|f0\rangle$. Since the energy of the state $|f0\rangle$ is closer to that of the excited state $|e1\rangle$, the second dispersive frequency shift increases. This, in turn, increases the differential shift, making it easier to discern between the states $|g0\rangle$ and $|f0\rangle$ using dispersive readout via the readout resonator 110. The $\pi$ pulse 308 may be alternatively configured to coherently transfer the population in the state $|g0\rangle$ state to the state $|h0\rangle$, wherein the readout resonator 110 is used to discern between the states $|e0\rangle$ and $|h0\rangle$.

One advantage of the readout method described above is that quantum computation is performed in the states $|g0\rangle$ and $|e0\rangle$, which benefits from the large detunings to the lowest excited states of the resonator 110. Thus, during quantum computation, heating of the fluxonium qubit 120 due to coupling with the resonator 110 is minimized, helping to preserve the long relaxation and dephasing times.

It is assumed in the previous discussion that the loop 132 of the fluxonium qubit 120 is continuously threaded by the external magnetic flux 130 during the entire readout method, as the external magnetic flux 130 is used to generate the energy-level structure shown in FIG. 3. However, the external magnetic flux 130 may be changed during the readout method. For example, a first magnetic flux 130 may be applied prior to and/or during the π pulse 308. Afterwards, a second magnetic flux 130 (with a magnitude different than that of the first magnetic flux 130) may be applied during sequent dispersive readout via the readout resonator 110.

While the above discussion describes the readout method with respect to the fluxonium qubit 120, those trained in the art will recognize that the readout method can be applied to another type of qubit, provided that the qubit has, or includes, a similar energy-level structure to that shown in FIG. 3. Thus, the reset method is not limited to fluxonium qubits, but may be used with other types of flux qubits, other types of superconducting-circuit qubits (e.g., phase qubits), and even non-superconducting-circuit qubits (e.g., ions, atoms, nitrogen-vacancy centers, etc.). In some of these other types of qubits, one or more of the microwave fields 302, 304, and 308 may need to be replaced with an oscillating electromagnetic field in a different part of the electromagnetic spectrum (e.g., infrared, visible, ultraviolet, etc.).

Figure 4:
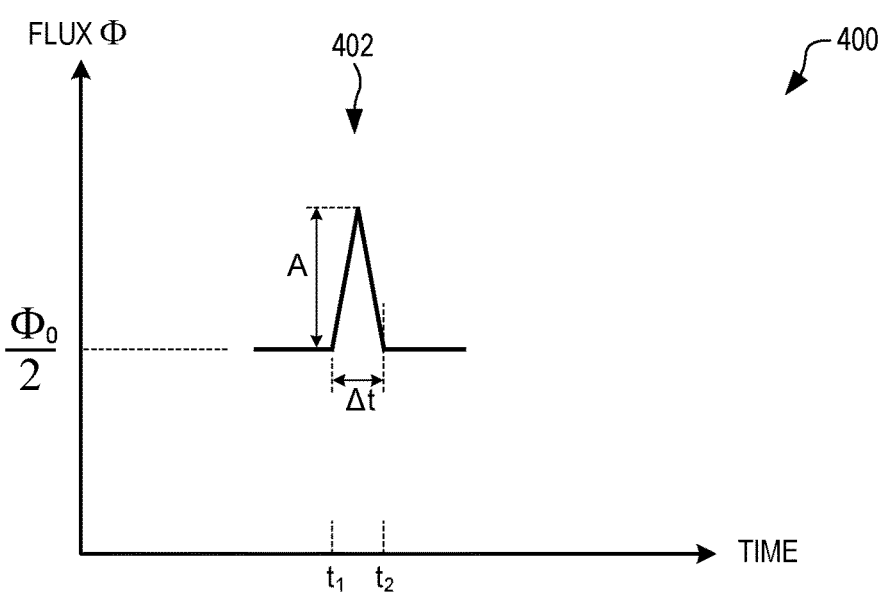
FIG. 4 is a plot of magnetic flux as a function of time, illustrating a fast magnetic pulse for single-qubit rotation of the fluxonium qubit of FIG. 1, in an embodiment.

FIG. 4 is a plot of magnetic flux (I) as a function of time, illustrating a fast magnetic pulse 402 for single-qubit rotation of the fluxonium qubit 120. The fluxonium qubit 120 may begin (i.e., before an initial time $t_1$) in any qubit state, i.e., any linear combination of the quantum-computational states |g⟩ and |e⟩. The fluxonium qubit 112 is continuously threaded with externally generated magnetic flux 130 at a nominal value. Starting at the initial time $t_1$, and lasting until a second time $t_2=t_1+\Delta t$, the pulse 402 is applied to the fluxonium qubit 120 by deviating the magnetic flux Φ away from the nominal value. In the example of FIG. 4, the magnetic flux Φ is increased above the nominal value by a pulse amplitude A. The value $\Delta t$ is a pulse duration of the pulse 402. While FIG. 4 shows the magnetic flux Φ returning to the same nominal value after the pulse 402 (i.e., starting at time $t_2$), the magnetic flux Φ may return to a different nominal value than that before the pulse 402 (i.e., prior to time $t_1$).

The magnetic pulse 402 is "fast" in the sense that the pulse duration $\Delta t$ is much less than the Larmor period (i.e., the inverse of the Larmor frequency $\omega_q$) of the fluxonium qubit 120. The Larmor frequency $\omega_q$ is given by the energy splitting of the states |g⟩ and |e⟩ when the magnetic flux Φ is at the nominal value $\Phi_0/2$. In the experimental results presented below, $\omega_q=14$ MHz, corresponding to a Larmor period of 71 ns. A pulse duration $\Delta t$ of approximately 2 ns was successfully demonstrated, more than an order of magnitude less than the Larmor period. In one embodiment, the pulse duration $\Delta t$ is less than one-fourth of the Larmor period.

Representing the qubit state as a Bloch vector on the Bloch sphere, the pulse 402 rotates the Bloch vector by an angle θ about the x axis of the Bloch sphere (see FIG. 11D). Due to the finite value of the pulse duration $\Delta t$, the pulse 402 also rotates the Bloch vector about the z axis of the Bloch sphere, albeit at a slower rate than rotation about the x axis. The symbol Δ denotes the ratio of the rotation rate about the z axis to the rotation rate about the x axis, where only $\lambda \leq 1$ is considered herein. Thus, the pulse 402 rotates the Bloch vector about the z axis by $\lambda|\theta|$, which is less than the angle θ by the factor λ. To minimize the rotation of the Bloch vector about the z axis, the pulse duration $\Delta t$ should be made as short as possible.

At the nominal value $\Phi_0/2$, the quantum-computational states |g⟩ and |e⟩ are separated by a nominal energy splitting ΔE that is equal to the Larmor frequency of the fluxonium qubit 120. As the magnetic flux Φ deviates from the nominal value $\Phi_0/2$, the pulse 402 effectively acts as a transverse magnetic field that couples the states |g⟩ and |e⟩, thereby increasing their energy splitting as the instantaneous flux Φ increasingly deviates away from the nominal value $\Phi_0/2$ (see FIG. 11B). The energy splitting will achieve a maximum energy splitting at the peak of the pulse 402. In one embodiment, the amplitude A is selected such that the maximum energy splitting is at least twice the nominal energy splitting.

While FIG. 4 shows the magnetic flux having a nominal value of approximately $\Phi_0/2$, the nominal value may be different than $\Phi_0/2$. In fact, FIG. 9A shows that the relaxation time $T_1$ of the fluxonium qubit 120 is smallest for magnetic fluxes near $\Phi_0/2$. Accordingly, it may be advantageous to operate at magnetic fluxes away from $\Phi_0/2$. Operation at a magnetic flux away from $\Phi_0/2$ will decrease the dephasing time $T_2$, which is largest at $\Phi_0/2$ (see FIG. 9B). However, the increase in $T_1$ may be greater than the reduction in $T_2$, giving rise to an optimal magnetic flux at which the coherence properties of the fluxonium qubit 120 are overall maximized.

While FIG. 4 shows the pulse 402 as being triangular with matched rising and falling edges (i.e., the slope of the rising edge equals the negative of the slope of the falling edge). However, the pulse 402 may have any other shape without departing from the scope hereof. For example, the pulse 402 may have a "simple" shape that monotonically deviates away from the nominal value $\Phi_0/2$ to a maximum deviation (either greater than or less than the nominal value), and then monotonically deviates from the maximum deviation back toward from the nominal value $\Phi_0/2$. The triangular pulse 402 shown in FIG. 4 is one example of a simple pulse shape that has no plateau (i.e., the pulse 402 does not "dwell" at any value of the flux). However, the pulse 402 may alternatively include one or more plateaus. The pulse may deviate linearly (e.g., rectangular, trapezoidal, triangular with unmatched rising and falling edges, etc.) or nonlinearly (e.g., Gaussian, Lorentzian, etc.). Alternatively, the pulse 402 may have a "complex" shape that changes slope any number of times, with or without one or more plateaus, before returning to the nominal value $\Phi_0/2$. For example, the pulse 402 may also cross the nominal value $\Phi_0/2$ one or more times before returning to the nominal value $\Phi_0/2$.

The pulse 402 can be advantageously generated using a commercial high-speed digital-to-analog converter (DAC), which is simpler to implement and requires fewer components than prior-art techniques in which superconducting-qubit control signals are generated by mixing an envelope function (e.g., as generated by an arbitrary waveform generator) with a high-frequency carrier. To increase stability, a DC power supply can be used to continuously output a DC current that generates the magnetic flux 130 at the nominal value. The DAC output may then be AC-coupled to the DC current such that the pulses 402 deviate the magnetic flux from the nominal value. Commercial DACs operate at speeds greater than 10 Gbps, and therefore can achieve pulse durations $\Delta t$ less than 1 ns.

Figure 5:
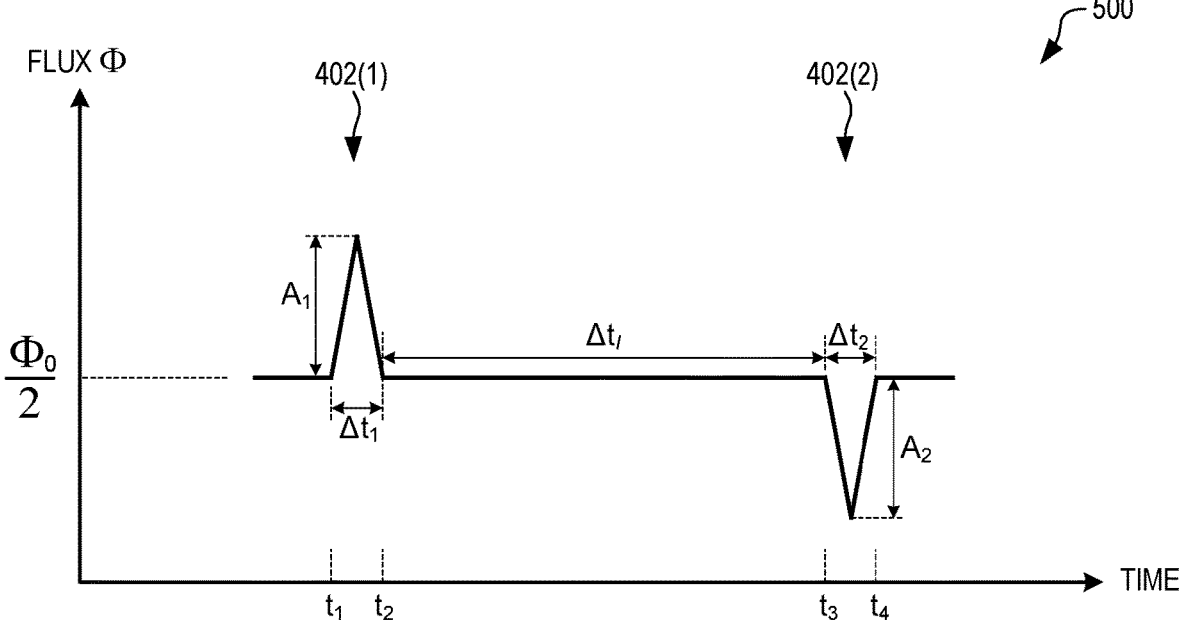
FIG. 5 is a plot of magnetic flux as a function of time, illustrating a magnetic-pulse sequence for universal single-qubit rotation of the fluxonium qubit of FIG. 1, in an embodiment.

FIG. 5 is a plot of magnetic flux $\Phi$ as a function of time, illustrating a magnetic-pulse sequence 500 for universal single-qubit rotation of the fluxonium qubit 120. The magnetic-pulse sequence 500 uses two of the fast pulses 402 shown in FIG. 4. The fluxonium qubit 120 may begin in any qubit state, i.e., any linear combination of the quantum-computational states $|g\rangle$ and $|e\rangle$. Before an initial time $t_1$, the fluxonium qubit 120 is threaded with externally generated magnetic flux 130 at a nominal value. Starting at the initial time $t_1$, and lasting until a second time $t_2 = t_1 + \Delta t_1$, a first pulse 402(1) is applied to the fluxonium qubit 120 by deviating the magnetic flux 130 in a first direction away from the nominal value. In the example of FIG. 5, the magnetic flux $\Phi$ is increased above the nominal value $\Phi_0/2$ by a first pulse amplitude $A_1$. The value $\Delta t_1$ is a first pulse duration of the first pulse 402(1).

Starting at the second time $t_2$, and lasting until a third time $t_3 = t_2 + \Delta t_1$, the fluxonium qubit 120 idles with the magnetic flux $\Phi$ at the nominal value $\Phi_0/2$ for an idling time $\Delta t_1$. Idling rotates the Bloch vector by a second angle $\theta_2 = \Delta t_1/\omega_q$ about the z axis of the Bloch sphere. The second angle $\theta_2$ can be controlled by extending and/or shortening the idling time $\Delta t_1$.

Starting at the third time $t_3$, and lasting until a fourth time $t_4 = t_3 + \Delta t_2$, a second pulse 402(2) is applied by to the fluxonium qubit 120 by deviating the magnetic flux 130 in a second direction, opposite the first direction, away from the nominal value $\Phi_0/2$. In the example of FIG. 5, the magnetic flux t is decreased below the nominal value $\Phi_0/2$ by a second pulse amplitude $A_2$. The value $\Delta t_2$ is a second pulse duration of the second pulse 402(2). The second pulse 402(2) rotates the Bloch vector by the negative of the first angle (i.e., $-\theta_1$) about the x axis of the Bloch sphere. Similar to the first pulse 402(1), the second pulse 402(2) also rotates the Bloch vector about the z axis of the Bloch sphere, due to the finite duration $\Delta t_2$, by $\lambda|\theta_1|$. Note that the absolute value of $\theta_1$ arises from the always-on rotation about the z axis.

The pulse amplitudes $A_1$, $A_2$ and pulse durations $\Delta t_1$, $\Delta t_2$, may be selected such that a first area of the first pulse 402(1) and a second area of the second pulse 402(2) sum to zero, wherein the magnetic-pulse sequence 500 is a zero-area pulse sequence. Here, the first and second areas are measured relative to the nominal value $\Phi_0/2$. Thus, in FIG. 5, the first pulse 402(1) has a positive area, and the second pulse 402(2) has a negative area. In one embodiment, $A_1 = -A_2$ and $\Delta t_1 = \Delta t_2$, as shown in FIG. 5. However, the pulse amplitudes $A_1$, $A_2$ and pulse durations $\Delta t_1$, $\Delta t_2$ may have other values such that the first and second pulse areas sum to zero.

It may be beneficial to configure each pulse 402 to minimize high-order harmonics (i.e., Fourier components of the sequence 500) that can inadvertently affect the behavior of the fluxonium qubit 120. To create "sharp" pulses 402, Fourier components will be needed at frequencies above $1/\Delta t_s$, where $\Delta t_s = \Delta t_1 + \Delta t_1 + \Delta t_2$ is a duration of the sequence 500. However, at frequencies far above $1/\Delta t_s$ (e.g., ten times larger, or more), the amplitudes of the Fourier components may need to be attenuated. For this reason, triangular pulses 402 may be preferable to rectangular pulses 402 since the Fourier spectrum of a triangular pulse train decreases faster with increasing frequency than that of a rectangular pulse train.

As described in more detail below, values for each of the angles $\theta_1$ and $\theta_2$ may be selected, based on a given value of $\lambda$, such that the magnetic-pulse sequence 500 (i.e., the combined sequential effects of the first pulse 402(1), the idling, and the second pulse 402(2)) rotates the Bloch vector about they axis of the Bloch sphere by 90°. In this case, the magnetic-pulse sequence 500 can transform the fluxonium qubit 120 from one of the pure states $|g\rangle$ and $|e\rangle$ into an equal superposition of the states $|_g\rangle$ and $|e\rangle$ (and vice versa). This version of the magnetic-pulse sequence 500 is functionally similar to a $\pi/2$ pulse, but can advantageously complete in a faster time. Accordingly, this version of the magnetic-pulse sequence 500 can replace any $\pi/2$ pulse used in any quantum gate or quantum-computation algorithm.

Also described below, values for each of the angles $\theta_1$ and $\theta_2$ may also be selected, based on a given value of $\lambda$, such that the magnetic-pulse sequence 500 rotates the Bloch vector about the y axis of the Bloch sphere by 180°. In this case, the magnetic-pulse sequence 500 can coherently transfer the fluxonium qubit 120 between the states $|g\rangle$ and $|e\rangle$. This version of the magnetic-pulse sequence 500 is functionally similar to a $\pi$ pulse, but can advantageously complete in a faster time. Accordingly, this version of the magnetic-pulse sequence 500 can replace any $\pi$ pulse used in any quantum gate or quantum-computation algorithm (e.g., the $\pi$ pulse 308, or the $\pi$ pulse 310).

While FIG. 5 shows the first and second pulses 402(1), 402(2) as triangular, one or both of the first and second pulses 402(1), 402(2) may alternatively have a different shape without departing from the scope hereof. For example, one or both of the first and second pulses 402(1), 402(2) may have a simple pulse shape (e.g., rectangular, trapezoidal, Gaussian, etc.) or a complex pulse shape, as described above for FIG. 4.

While FIG. 5 shows the each of the pulse durations $\Delta t_1$, $\Delta t_2$ as being less than the idling time $t_1$, one or both of the pulse durations $\Delta t_1$, $\Delta t_2$ may alternatively be greater than the idling time $t_1$. For example, each of the pulse durations $\Delta t_1$, $\Delta t_1$ may equal twice the idling time $t_1$, as may occur when each of the first and second pulses 402(1), 402(2) is rectangular. In some embodiments, there is no idling between the first and second pulses 402(1), 402(2), i.e., the second pulse 402(2) begins when the first pulse 402(1) ends, or $t_1 = 0$.

In one embodiment, the magnetic-pulse sequence 500 is applied twice to the fluxonium qubit 120 to rotate the Bloch vector by an arbitrary angle $\phi$ about the x axis of the Bloch sphere. In a first sequence 500, the angles $\theta_1$ and $\theta_2$ are selected such that the first sequence 500 rotates the Bloch vector by $-90°$ rotation about the y axis of the Bloch sphere. After the first sequence 500, the magnetic flux idles at the nominal value (e.g., $\Phi_0/2$), which rotates the Bloch vector by the arbitrary angle $\phi$ about the z axis of the Bloch sphere. After the idling, a second sequence 500 rotates the Bloch vector by $+90°$ about the y axis of the Bloch sphere.

Figure 6:
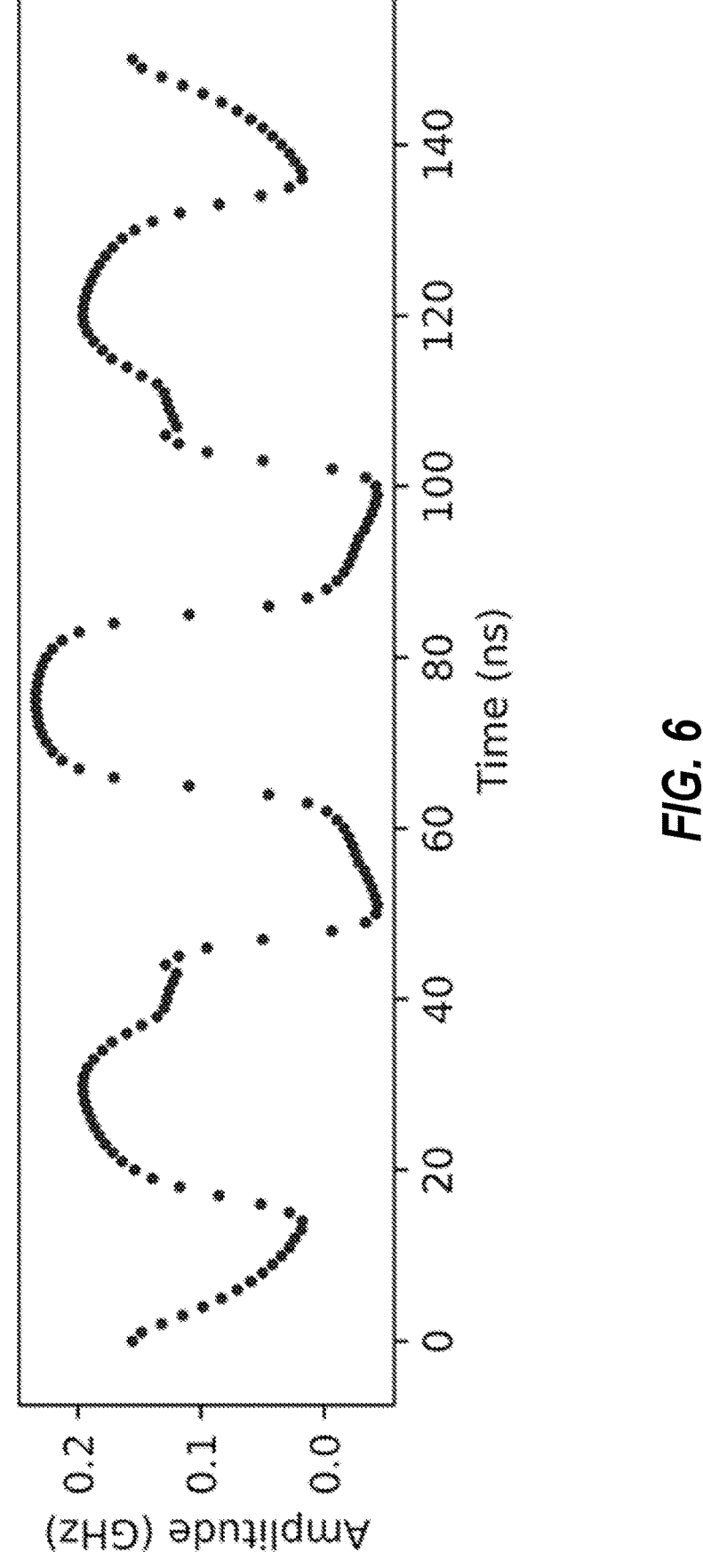
FIG. 6 shows one example of a complex pulse that crosses the nominal flux several times, in an embodiment.

FIG. 6 shows one example of a complex pulse that crosses the nominal flux several times. This pulse rotates the fluxonium qubit 120 but without idling. Accordingly, in an embodiment, the magnetic-pulse sequence 500 is a complex pulse that crosses the nominal flux one or more times, with or without idling.

In some embodiments, a method for manipulating a fluxonium qubit state includes applying a flux pulse (e.g., the pulse 402 of FIG. 4) to the fluxonium (e.g., the fluxonium qubit 120 of FIG. 1). The fluxonium may be biased at or near a flux of one-half the superconducting magnetic flux quantum $\Phi_0$, i.e., $\Phi_0/2$. Alternatively, the fluxonium may be biased away from $\Phi_0/2$. Said manipulating may occur in less than N periods of the Larmor oscillation (e.g., N=2 periods or N=10 periods). The flux pulse may include any one or more of the following properties: (1) starts and stops at the same flux (which gives composability); (2) has a net zero area (cuts of sensitivity to low frequency line filtering, etc.); (3) first- and/or second-order order insensitivity to low-frequency flux noise; (4) first- and/or second-order insensitivity to small changes of tunnel splitting; (5) first- and/or second-order insensitivity to small changes in the flux bias; (6) is filtered and/or generated with limited power contained in high frequencies for a given length of pulse (makes it easier to calibrate lines); (7) is filtered and/or generated with little power at frequencies near other transitions in the fluxonium (i.e., no leakage).

In some embodiments, a measurement method for determining a fluxonium qubit state may operate in a z basis (i.e., symmetric/anti-symmetric), wherein the fluxonium is biased at or near a flux of one-half the superconducting magnetic flux quantum $\Phi_0$ (i.e., $\Phi_0/2$). Alternatively, the measurement method may operate in or an x basis (which well), wherein the fluxonium is biased away from $\Phi_0/2$. In either case, the method includes performing a quantum non-demolition (QND) measurement on the fluxonium qubit state in the corresponding basis. A duration of the QND measurement may be shorter than the coherence time of the fluxonium. The QND measurement may also be "latching", i.e., is robust against qubit state changes during the measurement. When the QND measurement is latching, the duration of the QND measurement may be longer than the qubit coherence time.

The measurement method may use dispersive coupling of a fluxon state of the fluxonium to a structured radiation environment (e.g., a resonator, filter, cavity, etc.). In this case, active pulses may be used to probe the state-dependent change of the structured radiation environment. The measurement method may use shaped pulses. The measurement method may also use dispersive coupling of a plasmon state of the fluxonium to the structured radiation environment using one or more of the following: (1) direct occupation of the plasmon state; (2) virtual coupling to the plasmon state; (3) one or more active pulses to probe the state-dependent change of the structured radiation environment; (4) emission of energy of the plasmon state into a measurement apparatus; (5) one or more active pulses to probe the qubit state-dependence of plasmons; and (6) one or more shaped pulses. In some embodiments, a measurement method includes the manipulation method described above.

In some embodiments, an initialization method for cooling a fluxonium to a known state may use plasmons. For example, the initialization method may use one or more of plasmon dissipation, direct excitation of plasmons, and virtual excitation of plasmons to mediate coupling to a cold bath. The initialization method may also use radiative cooling. For example, the initialization method may implement radiative cooling using one or more of a transmission line, a structured radiation environment (e.g., a resonator, a bandpass filter, a high pass filter, a low-pass filter, etc.). Alternatively, the initialization method may use a combination of plasmons radiative cooling. The fluxonium (or another type of superconducting qubit) has a transition energy between its quantum-computational states that is small enough such that there is a significant equilibrium population of each of the quantum-computation states (i.e., $\hbar\omega < k_B T$, where $\hbar$ is Planck's constant divided by $2\pi$, $k_B$ is Boltzmann's constant, $\omega$ is the angular frequency corresponding to the transition energy, and T is the temperature of the environment). In one embodiment, $\hbar\omega < 5k_B T$. In another embodiment, $\hbar\omega \leq k_B T$.

In some embodiments, the initialization method uses the manipulation method(s) described above. In some embodiments, the initialization method uses the manipulation method(s) as well as the measurement method(s) described above.

In some embodiments, the measurement method is combined with the initialization method (e.g., the initialization method may be performed prior to the measurement method). Similarly, the initialization method may be combined with one or both of the measurement method and the manipulation method.

Experimental Demonstration

Introduction

Superconducting circuits are among the fastest developing candidates for quantum computers due to steady improvements in coherence times, gate fidelities, and processor size. These developments have ushered the noisy intermediate-scale quantum era and demonstrations of quantum advantage over classical computing. Many superconducting quantum processors are based on the transmon circuit, which since its inception has seen improvements in coherence by nearly 4-5 orders of magnitude driven largely by decreasing environmental noise. While the transmon circuit has seen widespread use in quantum computation, fluxonium offers many advantages over earlier flux qubits, including a rich level structure, natural protection from charge-noise induced relaxation and dephasing, and reduced sensitivity to flux noise. One of the challenges in making fluxonium a building block for superconducting qubit processors arises from the slow gates using standard microwave control.

In this section, we demonstrate high-fidelity control of a fluxonium circuit using a universal set of single-cycle flux gates on a qubit whose frequency is an order of magnitude lower than the ambient temperature. In the process, we reimagine all aspects of how the circuit should be controlled and operated, and demonstrate coherence times and gate fidelities that match or exceed those of the best transmon circuits, with the potential for further improvements.

The transmon is one of the simplest in the family of superconducting circuits, realizing a weakly anharmonic oscillator with large dipole matrix elements. This circuit trades off
increased sensitivity to decay, and a reduced anharmonicity for decreased sensitivity to charge-noise-induced dephasing. Despite the maximal susceptibility to relaxation, state-of-the-art transmons have relaxation ($T_1$) times around 100 μs, corresponding to Qs of a few million. The gate speeds are, however, limited by the small anharmonicity, typically ~5% of the qubit frequency $\omega_q$, resulting in a theoretical upper bound of $\sim\omega_q/(Q\alpha)\sim10^{-5}$ and state-of-the-art values of $\lesssim 1$-$2\times10^{-4}$ for the gate infidelity. This suggests that gate fidelities can be made to approach 1/Q by increasing the anharmonicity in comparison to the qubit frequency $\omega_q$, and performing gate operations within a few Larmor periods.

The flux qubit, another member of the superconducting circuit family, already has the desired level structure with a relative anharmonicity $\alpha/\omega_q \gg 1$. The extreme sensitivity to flux noise of these qubits was mitigated by shunting the Josephson junction with a large superinductor, resulting in the development of the fluxonium. Further improvements in energy relaxation times were obtained by the realization of a heavy fluxonium, which additionally reduced the decay matrix elements using a large shunting capacitor. These variants of fluxonium are reported to have longer coherence times than transmons in 3D architectures. Even though heavy fluxonium has the desired level structure and large coherence times, fast manipulation of the metastable qubit states remains a challenge due to the suppressed charge matrix elements. While Raman transitions can be used for coherent operations, these protocols are still relatively slow and require high drive powers, while exposing the qubit to the higher loss rates of excited fluxonium levels involved during the gate.

In this work, we realize a heavy-fluxonium circuit in a 2D architecture with coherence times $T_1$, $T_{2e}$~300 μs exceeding those of standard transmons. The frequency of the qubit transition is only 14 MHz, an order of magnitude lower than the temperature of the surrounding bath. Therefore, to initialize the qubit we develop and realize a reset protocol that utilizes the readout resonator and higher circuit levels to initialize the qubit with 97% fidelity, effectively cooling the qubit down to 190 μK. Lastly, we use flux pulses to realize high-fidelity single-qubit gates within a single period $2\pi/\omega_q$ of the Larmor oscillation.

The Heavy-Fluxonium Circuit

Figures 7A, 7B, 7C:
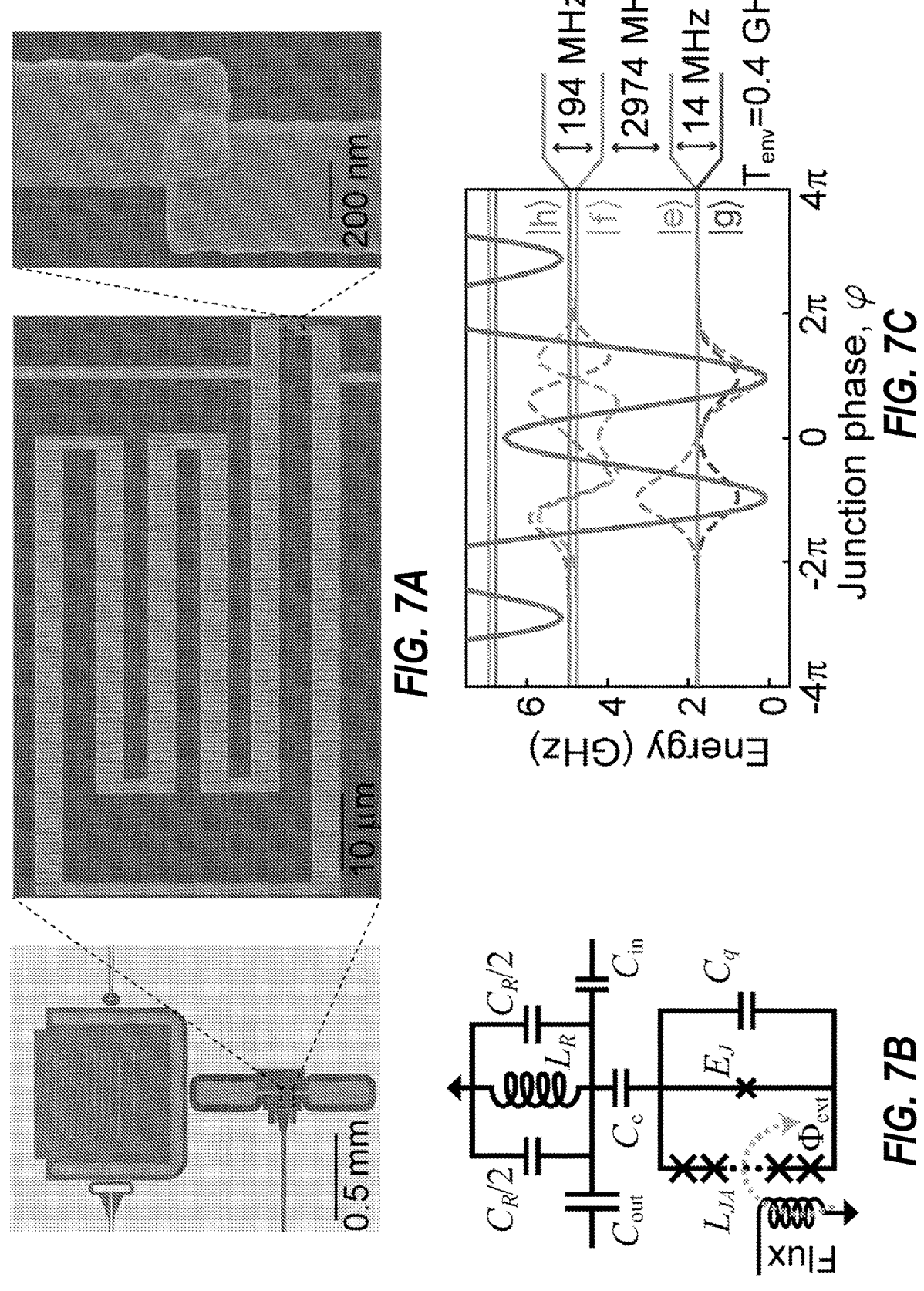
FIG. 7A shows an optical microscope image of a fluxonium circuit coupled to a readout resonator along with flux and input-output lines (left panel), a scanning electron micrograph of the large junction array and the small Josephson junction (center panel), and a zoom-in view of the small junction (right panel), in an embodiment.
FIG. 7B shows a circuit diagram for the heavy-fluxonium qubit, in an embodiment.
FIG. 7C shows an energy-level diagram of the heavy-fluxonium at the flux-frustration point.

The circuit consists of a small-area Josephson junction (JJ) with inductance $L_J$ shunted by a large inductance ($L_{JA}$), and a large capacitor ($C_q$), as shown in FIG. 7A. The shunting inductance is realized by an array of 300 large-area JJs, each having a Josephson energy $E_{JA}$ and charging energy $E_{CA}$. We make $E_{JA}/E_{CA} \gg 1$ to ensure that the charge dispersion for each array junctions is small, and the array can be regarded as a linear inductor. The corresponding effective circuit is shown in FIG. 7B, and the resulting Hamiltonian is given by Eqn. 1. The corresponding values for the reported device are: $E_C/h$=0.479 GHz, $E_L/h$=0.132 GHz, and $E_J/h$=3.395 GHz, where h is Planck's constant. The level structure of the fluxonium at the flux-frustration point ($\Phi_{ext}=\Phi_0/2$) is shown in FIG. 7C. There are two types of transitions of interest, the intra-well plasmons ($|g\rangle\leftrightarrow h\rangle$ and $|e\rangle\leftrightarrow|f\rangle$)) and the inter-well fluxons ($|g\rangle\leftrightarrow|e\rangle$ and $|f\rangle\leftrightarrow|h\rangle$)). The single-photon transitions $|g\rangle\leftrightarrow|f\rangle$ and $|e\rangle\leftrightarrow|h\rangle$ are forbidden at the flux-frustration point due to the parity selection rule. The qubit is comprised of the lowest two energy levels $|g\rangle$ and $|e\rangle$, with the qubit transition being fluxon like, with a frequency $\omega_q$ of 14 MHz.

Qubit Initialization and Readout

Due to its low transition frequency, the qubit starts in a nearly evenly-mixed state in thermal equilibrium. We first initialize the qubit in a pure state ($|g\rangle$ or $|e\rangle$)) using the reset protocol shown in FIG. 8A. In this protocol, we simultaneously drive both the $|g0\rangle\rightarrow|h0\rangle$ and $|h0\rangle\rightarrow|e1\rangle$ transitions for 15 μs. The high resonator frequency (5.7 GHz) in comparison to the physical temperature, and the low resonator quality factor Q=600 result in the rapid loss of a photon from $|e1\rangle$, effectively removing the entropy from the qubit. In conjunction with the large matrix element between $|h0\rangle$ and $|e1\rangle$, this steers the system into a steady state with over 95% of the population settling in $|e0\rangle$ in 5 μs. We subsequently perform an additional $\pi$ pulse on the $|g\rangle$-$|e\rangle$ transition to initialize the system in the ground state ($|g0\rangle$). The reset is characterized by performing a Rabi rotation between the $|e\rangle \leftrightarrow |f\rangle$ levels, as shown in FIG. 2(b). The Rabi contrast is doubled following reset, consistent with 50% of the population being in $|e\rangle$ in thermal equilibrium. If we prepare the system in $|g\rangle$, the $|e\rangle$ $\chi|f\rangle$ Rabi contrast indicates a 3±2% error in state preparation, depending on the $|f\rangle$ state thermal population. Since the $|f\rangle$ frequency is similar to the typical transmon frequencies, its thermal population is in line with that of most transmons. The effective qubit temperature following reset is ~190 μK, lower than the ambient temperature by a factor of 100.

Readout of the fluxonium levels is performed using circuit quantum electrodynamics by capacitively coupling the fluxonium circuit to a readout resonator. Since the qubit states are far away in frequency from the readout resonator, the dispersive shift x of the resonator due to a change in the occupation of computational states is small (60 kHz). While the large detuning reduces the qubit heating through the resonator, it makes direct dispersive readout challenging. We circumvent this issue by utilizing the larger dispersive interactions $\chi_f$, $\chi_h$ of the excited levels $|f\rangle$, $|h\rangle$, which are closer in frequency to the readout resonator. To improve readout fidelity, we thus perform a $\pi$ pulse on the $|e\rangle$-$|f\rangle$ transition in 80 ns, before standard dispersive readout. Since the population in $|e\rangle$ is transferred to $|f\rangle$, the readout signal becomes proportional to $(\chi_f$-$\chi_g)$, which is five times larger than $(\chi_e$-$\chi_g)$. This plasmon-assisted readout scheme results in 50% single-shot readout fidelity, which can be further improved with a parametric amplifier, and by optimizing the resonator K and the dispersive shifts.

Characterizing Device Coherence

Having developed protocols for initialization and readout, we characterize the coherence properties of the qubit. The inset of FIG. 9A shows a $T_1$=315±10 pts measured at the flux-frustration point following initialization of the qubit in either the $|g\rangle$ or $|e\rangle$ state. The qubit relaxes to a near equal mixture where the excited state population $P(|e\rangle)$=0.4955±0.0015, with the deviation providing an estimate of the temperature of the surrounding bath, T=42±14 mK. At the flux-frustration point, the wavefunctions are delocalized into symmetric and anti-symmetric combinations of the states in each well. As we move away from this degeneracy point, the wavefunctions localize into different wells resulting in a suppression of tunneling and an increase in the relaxation times, see FIG. 9A. Here, the qubit relaxation times were measured over a wide range of external flux by driving the $|g\rangle$-$|h\rangle$ transition for 120 μs to pump the qubit into the $|e\rangle$ state, and monitoring the subsequent decay. While moving away from the flux-frustration point, $T_1$ increases to a maximum value of 4.3±0.2 ms, consistent with previous heavy-fluxonium devices, before subsequently decreasing.

To explain the measured relaxation times, we consider several avenues by which the qubit can decay, including Purcell loss, decay via charge and flux coupling to the control lines, 1/f flux noise, dielectric loss in the capacitor, and resistive loss in the superinductor. Conservative estimates of the flux noise induced loss are lower than the measured loss by nearly an order of magnitude. The loss near the flux-frustration point is believed to be largely due to dielectric loss in the capacitor. This can be thought of as Johnson-Nyquist current noise from the resistive part of the shunting capacitor, which couples to the phase matrix element $\langle g|\hat{\phi}|e\rangle$, and grows rapidly as we approach the flux-frustration point. Assuming a fixed loss tangent for the capacitor, this loss rate is inversely proportional to the impedance of the capacitor, and is given by:

$$\Gamma_{diel} = \frac{\hbar\omega_q^2}{8E_C Q_{cap}}\coth\left(\frac{\hbar\omega_q}{2k_B T}\right)|\langle g|\hat{\phi}|e\rangle|^2. \tag{2}$$

The $T_1$ at the flux-frustration spot sets an upper bound of $1/Q_{cap}$=8×10⁻⁶ for the loss tangent of the capacitor, which is within a factor of three of the value reported in previous heavy-fluxonium devices, and results in the dashed curve in FIG. 9A. Since $\omega_q$ is below the ambient temperature near the flux-frustration point, a combination of the temperature-dependent prefactor ~$2k_B T/(\hbar\omega_q)$, and the relation between charge and phase matrix elements in fluxonium, $\langle$ g|n̂|e$\rangle$=$\omega$/(8E$_c$)$\langle$ g|$\hat\phi$|e$\rangle$, results in the dielectric-loss scaling as 1/$\omega$, which is consistent with the observed trend in the T$_1$ near the flux-frustration point. The measured T$_1$ at the flux-frustration point also sets an upper bound of 5×10$^{-9}$ for the loss tangent of the inductor. The decay from inductive loss, however, increases more rapidly with frequency than dielectric loss ($\propto$1/$\omega^3$) and is inconsistent with measured data. Our qubit operations are performed between 0.4$\Phi_0$-0.5$\Phi_0$ where the T$_1$ is mainly limited by dielectric loss. As we move further away from the flux-frustration point (~0.4$\Phi_0$), T$_1$ starts to decrease. This additional loss is believed to be due to a combination of radiative loss to the charge drive line, and Purcell loss from higher fluxonium levels excited by heating from the |g$\rangle$ and |e$\rangle$ states. The Purcell loss calculated based on the coupled fluxonium-resonator system using a bath temperature of 60 mK results in the dotted blue curve shown in FIG. 9A. The enhanced loss near $\Phi_{ext}$=0.35$\Phi_0$ is suggestive that heating to higher levels may contribute as there are several near resonances of higher fluxonium levels with the readout resonator, which depend sensitively on the circuit parameters.

The dephasing is characterized using a Ramsey sequence with three echo $\pi$ pulses, and found to be minimized at $\Phi_{ext}$=$\Phi_0$/2, where the qubit frequency is first-order insensitive to changes in flux. The dephasing rate near the flux-frustration point can be separated into two parts. The first is a frequency-independent term $\Gamma_C$ mainly composed of qubit depolarization, and dephasing from cavity photon shot noise and other flux insensitive white noise sources. The second arises from 1/f flux noise that is proportional to the flux slope as $$\Gamma_{1/f} = \frac{d\omega}{d\phi}\eta\sqrt{W},$$

where $\eta$ is in the flux-noise amplitude and W depends on the number of $\pi$ pulses in an echo experiment $$W = 4\ln2 - \frac{9}{4}$$

ln 3 for three $\pi$ pulses). Thus, our spin-echo signal decays as exp $$(-t/T_C)\times\exp(-\Gamma_{1/f}^2 t^2).$$

Here T$_C$=1/$\Gamma_C$ is the T$_{2e}$ value at the flux-frustration point. It is found to be ~300 $\mu$s, much higher than the T$_{2e}$ values for state-of-the-art transmons, see inset of FIG. 9B. The T$_{2e}$ values around the flux-frustration point, defined as the time for the echo oscillation amplitude to decay to 1/e are shown in FIG. 9B. This value falls off rapidly as we move away from the flux-frustration point, consistent with the small tunnel coupling between levels. Away from the flux-frustration point, T$_{2e}$ is mainly limited by 1/f flux noise. The T$_{2e}$ far from the frustration point is projected to be ~10 $\mu$s according to our model, which is consistent with other reported results.

Fast Single-Cycle Flux Gates

To maximize the advantage of the large anharmonicity of heavy fluxonium, we rethink the standard microwave-drive control of the circuit which is hindered by the suppressed charge matrix elements. We instead perform high-fidelity gates through fast flux pulses, similar to the control scheme used in the original charge qubit. Near the flux-frustration point where the fluxonium is operated, the Hamiltonian within the computational space can be idealized as a spin-½ system, $$\frac{H}{h} = \frac{A(\Phi_{ext})}{2}\sigma_x + \frac{\Delta}{2}\sigma_z.$$

Here $\Delta\approx$14 MHz is the splitting of |g$\rangle$ and |e$\rangle$ at the flux-frustration point, and corresponds to the qubit frequency $\omega_q$. The amplitude of the $\sigma_x$ term is proportional to the flux offset $\delta\Phi_{ext}$ from the flux-frustration point, and given by A=4$\pi$ $\langle$ g|$\hat\phi$|e$\rangle$E$_L\delta\Phi_{ext}$/h. The coefficient of the $\sigma_x$ term can be much larger than the qubit frequency, with A~300 MHz when $\delta\Phi_{ext}$=0.06$\Phi_0$, disallowing any rotating wave approximation.

FIG. 10A shows the protocol for a generic qubit pulse. We first rapidly move the flux-bias point away from the flux-frustration point in one direction and back, thus generating a rotation about the x axis through a large $\sigma_x$ term in our computational basis. There is additionally a relatively small rotation about the z axis corresponding to the time $\Delta t_p$ of the triangular spike. We subsequently idle at the flux-frustration point for a duration $\Delta t_z$, which results in a rotation by $\omega_q\Delta t_z$ about the z axis. Finally, we rapidly move the flux-bias point in the other direction and back, resulting in a −$\sigma_x$ term and another small z rotation. We choose the two spikes to be exactly anti-symmetric, ensuring zero net flux, simultaneously minimizing the effect of microsecond and millisecond pulse distortions ubiquitous in flux-bias lines, and echoing out low-frequency noise. The pulse is also immune to shape distortions since the total $\sigma_x$ and $\sigma_z$ amplitudes depend only on the area of the spike and $\Delta t_z$. By sweeping the amplitude A of the triangular spike and idling length $\Delta t_z$ of the pulse, and measuring the expectation value of the spin along each axis, we obtain the 2D Rabi patterns shown in FIG. 10C that provide a measure of our gate parameters. A vertical line cut of these graphs corresponds to Larmor precession in the lab frame, with an oscillation frequency of $\Delta$=14 MHz. We thus obtain a Z/2 gate by idling at the flux-frustration point for $\Delta t_z$=1/(4$\Delta$). We obtain a Y/2 gate at the point indicated by a star 1002, with the corresponding trajectories on the Bloch sphere for three different cardinal states shown in FIG. 10D. Y/2 and arbitrary rotations about the z axis are sufficient for universal control. An X/2 gate, for instance, is performed through the combination (−Y/2)·(Z/2)·(Y/2).

We characterized the fidelities of our single-qubit gates through randomized benchmarking (RB) and interleaved RB (IRB). RB provides a measure of the average fidelity of single-qubit Clifford gates and is performed by applying sequences containing varying number of Clifford gates on the state |e$\rangle$. For a given sequence length, we performed 75 randomized sequences, each containing a recovery gate to the state |e$\rangle$ before the final measurement. IRB allowed us to isolate the fidelities of individual computational gates and was performed by interleaving the gate between the random Clifford gates of the RB sequence. The averaged decay curves of P(|e$\rangle$) as a function of the sequence length for standard RB (black circles), and IRB for Z/2 (triangles), Y/2 (diamonds) and X/2 (squares) gates are shown in FIG. 10E. The infidelities thus extracted for the Y/2, Z/2, and X/2 gates are 8, 1, and 24×10$^{-4}$, respectively. The X/2 gate infidelity is slightly worse than the combined infidelities from two Y/2, and one Z/2 gate. The durations for Y/2 and Z/2 are ~20 ns, while that for the X/2 gate is ~60 ns, and thus all the computational gates are performed within one qubit Larmor period $2\pi/\omega_q=70$ ns, with all the operations occurring in the lab frame. The calculated decoherence limited errors of the Y/2, and X/2 gates are $6.67\times10^{-5}$ and $2\times10^{-4}$, suggesting that the major source of gate error arises from residual calibration errors in the pulse parameters, providing room for improvement even from these state-of-the-art values.

Experimental Setup

The experiment was performed in a Bluefors LD-250 dilution refrigerator with the wiring configured as shown in FIG. 11. The flux and charge inputs are attenuated with standard XMA attenuators, except the final 20 dB attenuator on the RF charge line (threaded copper). The DC and RF-flux signals were combined in a modified bias-tee (Mini-Circuits ZFBT-4R2GW+), with the capacitor replaced with a short. The DC and RF-flux lines included commercial low-pass filters (Mini-Circuits) as indicated. The RF flux and output lines also had additional low-pass filters with a sharp cutoff (8 GHz) from K&L microwave. Eccosorb (CR110) IR filters were added on the flux, and output lines, which helped improve the $T_1$ and $T_2$ times, and reduce the qubit and resonator temperatures. The device was heat sunk to the base stage of the refrigerator (stabilized at 15 mK) via an OFHC copper post, while surrounded by an inner lead shield thermalized via a welded copper ring. This was additionally surrounded by two cylindrical μ-metal cans (MuShield), thermally anchored using an inner close fit copper shim sheet, attached to the copper can lid. We ensured that the sample shield was light tight, to reduce thermal photons from the environment.

Device Fabrication

The device (see FIG. 7A) was fabricated on a 430 μm thick C-plane sapphire substrate. The base layer of the device, which includes the majority of the circuit (excluding the Josephson junctions), consists of 150 nm of niobium deposited via electron-beam evaporation, with features fabricated via optical lithography and reactive ion etch (RIE) at wafer-scale. 600 nm thick layer of AZ MiR 703 was used as the (positive) photoresist, and the large features were written using a Heidelberg MLA 150 Direct Writer, followed by RIE performed using a PlasmaTherm ICP Fluorine Etch tool. The junction mask was fabricated via electron-beam lithography with a bi-layer resist (MMA-PMMA) comprising of MMA EL11 and 950PMMA A7. The e-beam lithography was performed on a Raith EBPG5000 Plus E-Beam Writer. All Josephson junctions were made with the Dolan bridge technique. They were subsequently evaporated in Plassys electron beam Evaporator with double angle evaporation) (±19°). The wafer was then diced into 7×7 mm chips, mounted on a printed circuit board, and subsequently wire-bonded.

Deconstruction of Single-Qubit Gates

Modulation of the external flux drive with appropriate amplitude and duration is sufficient to perform arbitrary single-qubit rotations. The native gates available in our system are the arbitrary phase gate $R_z(\theta)$ which rotates the qubit by an arbitrary angle θ about the Z-axis and a combination of X- and Z-rotation $R_{xz}(\theta)$. $R_z(\theta)$ is realized by waiting for a period of $\Delta t_z=\theta/w_q$ (since we are working in the lab frame) whereas $R_{xz}(\theta)$ is implemented by a flux-drive applied for a duration of $\Delta t_p=\lambda\theta/\omega_q$. Here λ (λ≤1) is the ratio of Z-rotation to X-rotation rates. These rotation matrices can be expressed as, $$R_z(\theta) = e^{-i\sigma_z\theta/2}, \tag{C1}$$

$$R_{xz}(\theta) = e^{-i(\theta\sigma_x + \lambda|\theta|\sigma_z)/2}. \tag{C2}$$

The |θ| in Eqn. C2 arises due to the always-on Z-rotation which is unidirectional in the lab frame. A generic zero-flux-pulse can be constructed as, $$\underline{R}(\theta) = R_{xz}(-\theta_x) \cdot R_z(\theta_z) \cdot R_{xz}(\theta_x) \tag{C3}$$

A π/2 rotation about the Y-axis (Y/2), i.e., $$R_y(\pi/2) = \frac{1}{\sqrt{2}}\begin{pmatrix} 1 & -1 \\ 1 & 1 \end{pmatrix}, \tag{C4}$$

is obtained using $$\theta_x = \frac{1}{\sqrt{1+\lambda^2}}\cos^{-1}\left[\frac{\lambda(1+\lambda)}{-(1-\lambda)}\right], \tag{C5A}$$

$$\theta_z = 2\tan^{-1}\left[\frac{\sqrt{1-2\lambda-2\lambda^3-\lambda^4}}{(1+\lambda)\sqrt{1+\lambda^2}}\right] \tag{C5B}$$

in Eqn. C3 provided $0\leq\lambda\leq\sqrt{2}-1$. Similarly, we can construct $$R_y(\pi) = \begin{pmatrix} 0 & -1 \\ 1 & 0 \end{pmatrix} = -i\sigma_y \tag{C6}$$

using $$\theta_x = \frac{1}{\sqrt{1+\lambda^2}}\cos^{-1}(\lambda^2), \tag{C7A}$$

$$\theta_z = \pi - 2\tan^{-1}\left[\frac{\lambda}{\sqrt{1-\lambda^2}}\right], \tag{C7B}$$

with 0≤λ≤1. An arbitrary rotation about X-axis can be constructed using $$R_x(\theta) = R_y(\pi/2) \cdot R_z(\theta) \cdot R_y(-\pi/2). \tag{C8}$$

These gates are sufficient to construct any single-qubit unitary operation. We used the QuTiP Python package to simulate the evolution of the computational levels under application of the pulse shown in FIGS. 9A and 9B, and obtained the gate parameters. We swept the drive amplitude A and idling period $\Delta t_z$ in our simulation to match the sweep performed in the experiment, as shown in FIG. 12. For all experiments and simulations reported herein, $\Delta t_p$=4.76 ns.

Clifford Gate Lengths and Fidelities

A complete Clifford set includes the computational gates ($\exp(\pm i\pi\sigma_j/4)$, j=x, y) and the Pauli gates ($\exp(\pm i\pi\sigma_j/2)$, j=I, x, y, z). In this work, we constructed Y/2 and Z/2 gates, and used them as building blocks for the other gates in the Clifford Set. The total gate lengths, experimental infidelities (computational gates only), and gate compositions are shown in Table 1. The computational gate lengths range from 21-60 ns, and the longest Pauli gate (X) has a length of 78 ns. Since $2\pi/\omega_q \approx 70$ ns, the computational gates are all within a single cycle of the qubit, and the longest gate is around one cycle as well. The microwave driving gates have lengths longer than $\sim 10 \times 2\pi/\omega_q$, so our gates are 10 to 30 times faster.

TABLE 1

| Clifford Gate lengths and fidelities | | | |
|---|---|---|---|
| Gate | Length (ns) | Experimental Fidelity | Gate Composition |
| Y/2 | 21.19 | $8 \times 10^{-4}$ | |
| Z/2 | 17.87 | $1 \times 10^{-4}$ | |
| X/2 | 60.25 | $24 \times 10^{-4}$ | Y/2, Z/2, −Y/2 |
| Y | 42.38 | | Y/2, Y/2 |
| Z | 35.73 | | Z/2, Z/2 |
| X | 78.11 | | Y/2, Z, −Y/2 |

Fluxonium Matrix Elements and Reset Protocol

We derive the charge drive transition rates by simulating the full qubit-resonator dressed system. The drive power is normalized to 258 MHz so that the $|g0\rangle \rightarrow |h0\rangle$ $\pi$ pulse takes 80 ns, which corresponds to the typical experimental value. The simulated single-photon and two-photon transition rates (in MHz) are shown in Tables 2 and 3, respectively. The observed transition rates have additional contributions arising from the frequency dependence of the transmission through the drive line.

TABLE 2

| One-Photon Matrix Elements | | | | | | |
|---|---|---|---|---|---|---|
| | $|g0\rangle$ | $|e0\rangle$ | $|f0\rangle$ | $|h0\rangle$ | $|g1\rangle$ | $|e1\rangle$ |
| $|g0\rangle$ | | 0.0738 | | 6.2577 | 257.9425 | |
| $|e0\rangle$ | 0.0738 | | 5.8679 | | | 257.9425 |
| $|f0\rangle$ | | 5.8679 | | 1.2475 | 0.0138 | |
| $|h0\rangle$ | 6.2577 | | 1.2475 | | | 0.1028 |
| $|g1\rangle$ | 257.9425 | | 0.0138 | | | 0.0741 |
| $|e1\rangle$ | | 257.9425 | | 0.1028 | 0.0741 | |

TABLE 3

| Two-Photon Matrix Elements | | | | | | |
|---|---|---|---|---|---|---|
| | $|g0\rangle$ | $|e0\rangle$ | $|f0\rangle$ | $|h0\rangle$ | $|g1\rangle$ | $|e1\rangle$ |
| $|g0\rangle$ | | | 1.9213 | | | 0.9177 |
| $|e0\rangle$ | | | | 1.6489 | 0.4207 | |
| $|f0\rangle$ | 1.9213 | | | | | 0.0644 |
| $|h0\rangle$ | | 1.6489 | | | 0.1258 | |
| $|g1\rangle$ | | 0.4207 | | 0.1258 | | |
| $|e1\rangle$ | 0.9177 | | 0.0644 | | | |

We utilized the $|g0\rangle \rightarrow |h0\rangle$ and $|h0\rangle \rightarrow |e1\rangle$ transitions for the reset protocol due their large matrix elements. While the $|g0\rangle \rightarrow |e1\rangle$ two-photon process also has a relatively high rate, its use results in deleterious consequences since it lies in the middle of other transitions. The excited state population as a function of reset time is shown in FIG. 13. The majority of the population is pumped to state $|e\rangle$ in 5 μs, which is mainly determined by the $|h0\rangle \rightarrow |e1\rangle$ transition rate. We subsequently perform an additional $\pi$ pulse on the $|g\rangle$-$|e\rangle$ transition to initialize the system in the ground state $|g0\rangle$.

Plasmon-Assisted Readout

The resonator frequency shifts in increasing order are $\chi_e$, $\chi_g$, $\chi_h$, $\chi_f$. We selected the $|g\rangle$, $|f\rangle$ states for plasmon-assisted readout since $\chi_f$-$\chi_g$ is larger than $\chi_h$-$\chi_e$. This is reflected in the single-shot readout histogram data for $|g\rangle$, $|e\rangle$, $|f\rangle$, $|h\rangle$ as shown in FIGS. 14A and 14B. The histograms in FIG. 14A are not well separated since the current sample is not optimized for high-fidelity readout.

Modeling Fluxonium Relaxation

To explain the measured relaxation times of the fluxonium, we consider decay via charge and flux coupling to the control lines, 1/f flux noise, dielectric loss in the capacitor, resistive loss in the superinductor, and Purcell loss. The decay rates arising from these loss mechanisms are derived using Fermi's golden rule, with the bath described using the Caldeira-Leggett model. For a noise source with amplitude f(t) and coupling constant $\alpha$ between the fluxonium qubit states, the interaction Hamiltonian can be written as $H'=\alpha f(t)\sigma_x$ in the qubit subspace. This results in a qubit depolarization rate, $$\Gamma = \frac{\alpha^2}{\hbar^2}(S_f(+\omega_{01}) + S_f(-\omega_{01})). \tag{G1}$$

Here $$S_f(\omega) = \int_{-\infty}^{\infty} e^{i\omega\tau}\langle < f(\tau)f(0)\rangle$$

is the noise spectral density associated with the source. We note that at a finite bath temperature corresponding to an inverse temperature $$\beta = \frac{1}{k_B T},$$

detailed balance relates the positive and negative frequency components of the noise spectral density as $S_f(-\omega)/S_f(\omega)=e^{-\beta\hbar\omega}$. Depending on the noise source f, the coupling constant $\alpha$ is proportional to the charge or phase matrix element of the fluxonium. Since the only term in the Hamiltonian that does not commute with $\hat{\phi}$ is the charging energy $4E_c\hat{n}^2$, and $[\hat{\phi}, \hat{n}]=i$, $$\langle j|[\hat{\phi}, \hat{H}]|k\rangle = (\omega_j - \omega_k)\langle j|\hat{\phi}|k\rangle \tag{G2}$$
$$= i(8E_c)\langle j|\hat{n}|k\rangle.$$

The matrix elements of the fluxonium circuit are thus related by $$|\langle g0|\hat{n}|g1\rangle| = \left(\frac{\omega}{8E_c}\right)|\langle g0|\hat{\phi}|g1\rangle|$$

for all flux values.

Relaxation from Flux Noise

Flux noise couples to the phase degree of freedom with an interaction strength that depends on the inductive energy $E_L$. Expanding the fluxonium potential to lowest order in flux results in a coupling constant of $\alpha=2\pi E_L\langle g0|\hat{\phi}|g1\rangle/\Phi_0$. We consider flux noise contributions from current noise in the flux-bias line, as well as 1/f flux noise. In our experimental setup, the current noise is believed to be mainly due to resistive Johnson-Nyquist noise arising from a 10-dB attenuator with resistance R=26Ω (last resistor in T network) on the fast flux line, corresponding to current noise spectral density of $$S_I(\omega) = \frac{2}{R} \frac{\hbar\omega}{\left(1 - e^{-\beta\hbar\omega}\right)},$$

with the expected interpolation between quantum and thermal noise. This is related to flux noise by the mutual inductance M=θ₀/1.6 mA between flux line and the qubit, obtained from the DC flux period. Therefore, $$S_f(\omega) + S_f(-\omega) = 2\hbar\omega \frac{M^2}{R} \coth\left(\frac{\beta\hbar\omega}{2}\right),$$

and the decay rate $$\Gamma_R = \pi^3 \left(\frac{R_Q}{R}\right)\left(\frac{M}{L}\right)^2 |\langle g0|\hat{\varphi}|g1\rangle|^2 \,\omega\coth\left(\frac{\beta\hbar\omega}{2}\right), \qquad \text{(G3)}$$

where $R_Q = h/e^2$ is the resistance quantum, and L is the fluxonium inductance.

For 1/f flux noise, the noise spectral density is of the form $S_\phi(\omega) = 2\pi\eta^2/\omega$, with the resulting decay rate, $$\Gamma_{1/f} = 8\pi^3 \left(\frac{E_L}{\hbar}\right)^2 \left(\frac{\eta}{\Phi_0}\right)^2 \frac{|\langle g0|\hat{\varphi}|g1\rangle|^2}{\omega}. \qquad \text{(G4)}$$

The 1/f noise amplitude is fit from $T_{2e}$ data, and corresponds to η=5.21μΦ₀. The suppression of the 1/f noise induced decay by $$E_L^2,$$

results in a limit of $T_1$=2.4 ms for the relaxation time at the flux-frustration point, which grows rapidly ($\propto\omega^3$) as we move away from it.

Relaxation from Radiation Loss to the Charge Line

In addition to current noise, the fluxonium could also be affected by radiative loss arising from Johnson-Nyquist voltage noise $$\left(S_V(\omega) = \frac{2R\hbar\omega}{1 - e^{-\beta\hbar\omega}}\right)$$

that couples to the qubit via spurious charge coupling, with the resistance R serving as a phenomenological parameter. In this case, the coupling constant is related to the charge matrix element as α=2e⟨ g0|ñ|g1⟩ , and $$S_f(\omega) + S_f(-\omega) = 2R\hbar\omega\coth\left(\frac{\beta\hbar\omega}{2}\right).$$

The resulting decay rate is $$\Gamma_c = \frac{\omega}{Q_c}\coth\left(\frac{\beta\hbar\omega}{2}\right)|\langle g0|\hat{n}|g1\rangle|^2, \qquad \text{(G5)}$$

where $$Q_c = \frac{R_Q}{16\pi R}.$$

An upper-bound for the resistance R can be found using the plasmon $T_1$ of 10 μs, corresponding to a total quality factor of 1.86×10⁵, and $Q_c$=7.4×10⁴. This results in a fluxon $T_1$ limit in excess of 60 ms at the flux-frustration point.

Relaxation from Dielectric Loss in the Capacitor

Dielectric loss associated with the capacitor can be thought of as Johnson-Nyquist current noise from the resistive part of the shunting capacitor, which couples to the phase matrix element ⟨ g|φ̂|e⟩ . This loss rate is therefore inversely proportional to the impedance of the capacitor, assuming a fixed loss tangent (1/$Q_{diel}$) for the capacitor. As a result, $$S_f(\omega) + S_f(-\omega) = \frac{\hbar\omega^2 C}{Q_{diel}}\coth\left(\frac{\beta\hbar\omega}{2}\right), \qquad \text{(G6)}$$

$$\text{and } \Gamma_{diel} = \frac{\hbar\omega^2}{8E_C Q_{cap}}\coth\left(\frac{\beta\hbar\omega}{2}\right)|\langle g0|\hat{\phi}|g1\rangle|^2.$$

If the $T_1$ at the frustration point were limited by dielectric loss, a bath temperature of 42 mK would result in $Q_{cap}$=1/(8×10⁻⁶). This is close to the expected loss tangent and within a factor of two of that observed in similar fluxonium devices. This is believed to be the dominant loss channel near the frustration point, also capturing the flux/frequency dependence of the measured loss ($\propto 1/\omega$).

Relaxation from Dielectric Loss in the Inductor

For inductive loss, we again assume a frequency independent loss tangent (L→L(1+i/$Q_{ind}$)), resulting in Johnson-Nyquist current noise that is inversely proportional to the impedance of the superinductor, i.e., $$S_f(\omega) + S_f(-\omega) = \frac{\hbar}{LQ_{ind}}\coth\left(\frac{\beta\hbar\omega}{2}\right).$$

the inductive loss is thus, $$\Gamma_{ind} = \frac{E_L}{\hbar Q_L}\coth\left(\frac{\beta\hbar\omega}{2}\right)|\langle g0|\hat{\phi}|g1\rangle|^2. \qquad \text{(G7)}$$

The superinductor is extremely low loss, with a quality factor of $Q_{ind}$=5×10⁹ resulting in a limit of $T_1$=2 ms at the flux frustration point, growing as $\omega^3$ as we move away from the flux-frustration point.

Relaxation Rate Due to the Purcell Effect

We derive the Purcell relaxation rates of the fluxonium levels, arising from coupling to the resonator. We model this by assuming that the resonator is coupled to a bath of harmonic oscillators, whose Hamiltonian reads $$H_{bath} = \sum_k \hbar\omega_k b_k^\dagger b_k, \tag{G8}$$

where $b_k$ is the lowering operator for mode k. The interaction Hamiltonian between the bath and the resonator is given by $$H_{int} = \hbar\sum_k \lambda_k\left(ab_k^\dagger + a^\dagger b_k\right), \tag{G9}$$

where a is the lowering operator for the resonator. Finally, the system under consideration is the fluxonium circuit coupled to the resonator, which we write in the dressed basis as $$H_{flux+res} = \sum_k E_k^{flux+res}\left|\psi_k^{flux+res}\right\rangle\left\langle\psi_k^{flux+res}\right|. \tag{G10}$$

We treat $H_{int}$ as a perturbation which can induce transitions among the eigenstates of the Hamiltonian $H=H_{bath}+H_{flux+res}$, given by $$|\psi_i\rangle = \left|\psi_i^{flux+res}\right\rangle \otimes_k |m_k\rangle. \tag{G11}$$

The transition rate under the action of a constant perturbation is given by Fermi's Golden Rule in the form $$\gamma_{i\to f} = \frac{2\pi}{\hbar}\delta(E_i - E_f)|\langle\psi_f|H_{int}|\psi_i\rangle|^2, \tag{G12}$$

where $E_i$ and $E_f$ are the eigenenergies of the states $|\psi_i\rangle$ and $|\psi_f\rangle$, respectively. These energies are $$E_i = E_i^{flux+res} + \hbar\sum_k m_k\omega_k, \tag{G13}$$

$$E_f = E_f^{flux+res} + \hbar\sum_k m_k'\omega_k,$$

where $\{m_k\}$ denotes the initial configuration of the bath and $\{m_k'\}$ the final configuration. Inserting the form of $H_{int}$ into Eqn. G12 and noting that cross-terms vanish leads to $$\gamma_{i,\{m_k\}\to f,\{m_{k'}\}} = \tag{G14}$$

$$2\pi\hbar\delta(E_i - E_f)\sum_k |\lambda_k|^2\left(\left|\left\langle\psi_f^{flux+res}\right|a^\dagger\left|\psi_i^{flux+res}\right\rangle\right|^2 m_k\delta_{m_{k'},m_k-1} + \right.$$

$$\left.\left|\left\langle\psi_f^{flux+res}\right|a\left|\psi_i^{flux+res}\right\rangle\right|^2(m_k + 1)\delta_{m_{k'},m_k+1}\right)\prod_{k'\neq k}\delta_{m_{k'}}$$

To find the total transition rate, we must sum over all such initial and final configurations, taking into account the thermal probability of occupying a given initial configuration:

$$\Gamma_{i\to f} = \sum_{\{m_k\},\{m_{k'}\}} P(\{m_k\})\gamma_{i,\{m_k\}\to f,\{m_{k'}\}}, \tag{G15}$$

where $$P(\{m_k\}) = \frac{e^{-\Sigma_k \beta m_k \hbar\omega_k}}{Z}, \tag{G16}$$

Z is the partition function of the bath and $\beta=1/k_B T$. Performing the sums over all initial and final states yields $$\Gamma_{i\to f} = 2\pi\hbar \tag{G17}$$

$$\sum_k |\lambda_k|^2\delta(E_i^{flux+res} - E_f^{flux+res} + \hbar\omega_k)\left|\left\langle\psi_f^{flux+res}\right|a^\dagger\left|\psi_i^{flux+res}\right\rangle\right|^2 n_{th}(\omega_k) +$$

$$2\pi\hbar\sum_k |\lambda_k|^2\delta(E_i^{flux+res} - E_f^{flux+res} - \hbar\omega_k)$$

$$\left|\left\langle\psi_f^{flux+res}\right|a\left|\psi_i^{flux+res}\right\rangle\right|^2(n_{th}(\omega_k) + 1),$$

where $$n_{th}(\omega_j) = \sum_{\{m_k\}} P(\{m_k\})m_j = \frac{1}{e^{\beta\hbar\omega_j} - 1}. \tag{G18}$$

We next take the continuum limit and define $\kappa=2\pi\hbar\rho(\omega_k)|\lambda_k|^2$ where $\rho(\omega)$ is the density of states of the bath. Introducing $$\omega_{jj'}^{flux+res} = \left(E_j^{flux+res} - E_{j'}^{flux+res}\right)/\hbar$$

leads to the expressions $$\Gamma_{i\to f}^\uparrow = kn_{th}\left(\omega_{fi}^{flux+res}\right)\left|\left\langle\Psi_f^{flux+res}\right|a^\dagger\left|\Psi_i^{flux+res}\right\rangle\right|^2,$$

for upward transitions $$E_f^{flux+res} > E_i^{flux+res}, \text{ and}$$

$$\Gamma_{i\to f}^\downarrow = k\left(n_{th}\left(-\omega_{fi}^{flux+res}\right) + 1\right)\left|\left\langle\psi_f^{flux+res}\right|a\left|\psi_i^{flux+res}\right\rangle\right|^2,$$

for downward transitions $$E_f^{flux+res} < E_i^{flux+res}.$$

The final step is to note that throughout this experiment, the fluxonium qubit is operated in the dispersive regime with respect to the frequency of the resonator. Therefore, we expect that the dressed eigenstates of $H_{flux+res}$ can be labeled with quantum numbers $\ell$ and n, with $\ell$ labeling the fluxonium state and n the resonator state. When performing numerical simulations, this identification is based on which numbers $\ell$ and n produce the maximum overlap of the dressed state $$\left|\psi_i^{flux+res}\right\rangle = \overline{|\ell, n\rangle}$$

with the product state $|\ell, n\rangle$. We are interested mainly in transitions among fluxonium states, where the quantum number $\ell$ changes. We therefore define the total transition rate due to the Purcell effect among fluxonium states as a sum over all possible initial and final states of the resonator, weighting initial states by their probability of being thermally occupied $P_{res}(n)=(1-\exp(-\beta\hbar\omega_r))\exp(-n\beta\hbar\omega_r)$. This yields $$\Gamma_{\ell\to\ell'}^{Purcell,\uparrow} = \sum_{n,n'} P_{res}(n)\kappa n_{th}(\omega_{\ell',n',\ell,n}) \times |\langle \overline{\ell',n'}|a^\dagger|\overline{\ell,n}\rangle|^2, \quad (G21)$$

for upward transitions, where $\omega_{\ell',n',\ell,n} =(E_{\ell',n'} - E_{\ell,n})/\hbar$, and $$\Gamma_{\ell\to\ell'}^{Purcell,\downarrow} = \sum_{n,n'} P_{res}(n)\kappa(n_{th}(-\omega_{\ell',n',\ell,n}) + 1) \times |\langle \overline{\ell',n'}|a|\overline{\ell,n}\rangle|^2, \quad (G22)$$

for downward transitions. The direct Purcell loss $(|e\rangle \to |g\rangle)$ gives a $T_1$ limit ~100 ms, effectively negligible in our experiments. However, heating to the excited levels of fluxonium due to the finite bath temperature, results in enhanced Purcell loss. Some of these states ($8^{th}$, $9^{th}$ and $10^{th}$ eigenstates) have transition frequencies from the logical manifold that are close to the resonator frequency, resulting in avoided crossings. While their exact location depends sensitively on the circuit parameters, these resonances are likely responsible for the decreased $T_1$ observed near $0.35\Phi_0$. The total Purcell relaxation rate for a bath temperature of 60 mK corresponds the dotted curve in FIG. 9A.

Modeling Fluxonium Dephasing

On the flux slope, the decay envelope of a Ramsey experiment is best approximated by a gaussian exp $$(-t^2/T_\phi^2),$$

where $$T_\phi = \Gamma_\phi^{-1} = \left(\sqrt{2}\,\eta(\partial_\phi\omega_{01})\left(\sqrt{\ln\omega_{ir}t}\right)\right)^{-1} \quad (45)$$

to first order. For the spin-echo experiments, low-frequency noise has a reduced weight in the noise spectrum, with $T_\phi=(\sqrt{W}\eta(\partial_\phi\omega_{01}))^{-1}$. At the flux frustration point, the qubit is first-order insensitive to 1/f flux noise, and the spin-echo data can be explained with an exponential decay from white noise $$(T_{2e} = T_C = \Gamma_C^{-1}).$$

In the regime of our spin-echo flux sweep, both noise sources contribute significantly. The data is therefore fit to a product of a gaussian and an exponential, with the $T_{2e}$ defined as exp $$(-T_{2e}/T_C - T_{2e}^2/T_\phi^2) = 1/e, \text{ i.e.,}$$

$$T_{2e} = \frac{\sqrt{1/T_C^2 + 4/T_\phi^2} - 1/T_C}{2/T_\phi^2}. \quad (H1)$$

CONCLUSION

We have realized a heavy-fluxonium qubit with a 14 MHz transition frequency and coherence times exceeding those of state-of-the-art transmons, while demonstrating protocols for plasmon-assisted reset and readout of the qubit, and a new flux control scheme that performs fast high-fidelity gates. We have explored a new frequency regime in superconducting qubits and demonstrated the feasibility of a sub-thermal frequency qubit, providing a path for manipulating fluxonium qubits with computational frequencies in the range of several GHz at temperatures much higher than current dilution-refrigerator temperatures. Our new control scheme has dramatically improved the single-qubit gate speed of fluxonium qubits, making them a viable candidate for large-scale superconducting quantum computation. The gate pulses can be directly synthesized with inexpensive digital to analog converters, and are insensitive to shape distortions. Furthermore, the single-qubit gate scheme used in this work can be generalized to two inductively coupled fluxonium circuits, allowing for two-qubit gate operations without involving the participation of excited levels with more loss.

COMBINATION OF FEATURES

Features described above as well as those claimed below may be combined in various ways without departing from the scope hereof. The following examples illustrate possible, non-limiting combinations of features and embodiments described above. It should be clear that other changes and modifications may be made to the present embodiments without departing from the spirit and scope of this invention:

(A1) A method for initializing a quantum system formed from a qubit coupled to an energy dissipater includes exciting the quantum system from a first quantum state to a second quantum state. The qubit has a qubit ground state, a qubit metastable state, a first qubit excited state, and a second qubit excited state lying above the first qubit excited state. The first quantum state is a composite of the qubit ground state and a dissipater ground state of the energy dissipater, and the second quantum state is a composite of the second qubit excited state and the dissipater ground state. The method also includes coupling the quantum system from the second quantum state to a third quantum state that is a composite of the qubit metastable state and a dissipater excited state of the energy dissipater. The quantum system decays from the third quantum state to a fourth quantum state that is a composite of the qubit metastable state and the dissipater ground state.

(A2) In the method denoted A1, the qubit may be a flux qubit.

(A3) In the method denoted A2, the flux qubit may be a fluxonium qubit.

(A4) In either one of the methods denoted A2 and A3, the flux qubit may be a fluxonium qubit.

(A5) In any one of the methods denoted A2 to A4, the qubit ground state and the qubit metastable state may be connected via a fluxon-like transition, the qubit ground state and the second qubit excited state may be connected via a plasmon-like transition, and the qubit metastable state and the first qubit excited state may be connected via a plasmon-like transition.

(A6) In any one of the methods denoted A2 to A5, the method further includes threading the flux qubit with magnetic flux to form the qubit ground state, the qubit metastable state, the first qubit excited state, and the second qubit excited state (A7) In the method denoted A6, the magnetic flux may be one-half of a superconducting magnetic flux quantum.

(A8) In either one of the methods denoted A6 and A7, said threading, said exciting, and said coupling may occur simultaneously.

(A9) In the method denoted A8, a duration of said threading, said exciting, and said coupling may be less than both a qubit relaxation time and a qubit dephasing time of the flux qubit.

(A10) In any one of the methods denoted A1 to A9, the energy dissipater may be a resonator or a transmission line.

(A11) In any one of the methods denoted A1 to A10, said exciting may include driving the quantum system with a first microwave field having a first frequency that is resonant with a first transition between the first and second quantum states. Said coupling may include driving the quantum system with a second microwave field having a second frequency that is resonant with a second transition between the second and third quantum states.

(A12) In any one of the methods denoted A1 to A11, the method may further include transferring, with a pi pulse, the quantum system from the fourth quantum state to the first quantum state.

(A13) In the method denoted A12, a frequency of the pi pulse may be resonant with a transition between the fourth and first quantum states.

(A14) In any one of the methods denoted A1 to A13, the method may further include preparing, prior to said exciting and said coupling, the quantum system such that the qubit is in a thermal mixed state of the qubit ground state and the qubit metastable state. The quantum system, after subsequently decaying from the third quantum state to the fourth quantum state, may then be in an approximately pure quantum state.

(A15) In any one of the methods denoted A1 to A14, a qubit transition frequency between the qubit ground state and the qubit metastable state may be less than or equal to a temperature of a thermal bath surrounding the quantum system.

(A16) In any one of the methods denoted A1 to A15, the qubit metastable state may have a significant thermal occupation prior to said exciting.

(A17) In any one of the methods denoted A1 to A16, the method may further include cryogenically cooling the quantum system such that a temperature of a thermal bath surrounding the quantum system is greater than or equal to a qubit transition frequency between the qubit ground state and the qubit metastable state.

(B1) A method for initializing a quantum system formed from a qubit coupled to an energy dissipater includes exciting the quantum system from a first quantum state to a second quantum state. A qubit transition frequency between a qubit ground state of the qubit and a qubit metastable state of the qubit is less than or equal to a temperature of a thermal bath surrounding the quantum system. The first quantum state is a composite of the qubit ground state and a dissipater ground state of the energy dissipater, and the second quantum state is a composite of a second qubit excited state and the dissipater ground state. The method also includes coupling the quantum system from the second quantum state to a third quantum state that is a composite of the qubit metastable state and a dissipater excited state of the energy dissipater.

(B2) In the method denoted B1, the qubit may be a flux qubit.

(B3) In the method denoted B2, the flux qubit may be a fluxonium qubit.

(B4) In either one of the methods denoted B2 and B3, the flux qubit may be a heavy fluxonium qubit.

(B5) In any one of the methods denoted B2 to B4, the qubit ground state and the qubit metastable state may be connected via a fluxon-like transition. The qubit ground state and the qubit excited state may be connected via a plasmon-like transition.

(B6) In any one of the methods denoted B2 to B5, the method may further include threading the flux qubit with magnetic flux to form the qubit ground state, the qubit metastable state, and the qubit excited state.

(B7) In the method denoted B6, the magnetic flux may be one-half of a superconducting magnetic flux quantum.

(B8) In either one of the methods denoted B6 and B7, said threading, said exciting, and said coupling may occur simultaneously.

(B9) In the method denoted B8, wherein a duration of said threading, said exciting, and said coupling may be less than both a qubit relaxation time and a qubit dephasing time of the flux qubit.

(B10) In any one of the methods denoted B1 to B9, the energy dissipater may be a resonator or a transmission line.

(B11) In any one of the methods denoted B1 to B10, said exciting may include driving the quantum system with a first microwave field having a first frequency that is resonant with a first transition between the first and second quantum states. Said coupling may include driving the quantum system with a second microwave field having a second frequency that is resonant with a second transition between the second and third quantum states.

(B12) In any one of the methods denoted B1 to B11, the quantum system decays from the third quantum state to a fourth quantum state that is a composite of the qubit metastable state and the dissipater ground state. The method may further include transferring, with a pi pulse, the quantum system from the fourth quantum state to the first quantum state.

(B13) In the method denoted B12, a frequency of the pi pulse may be resonant with a transition between the fourth and first quantum states.

(B14) In any one of the methods denoted B1 to B13, the method may further include preparing, prior to said exciting and said coupling, the quantum system such that the qubit is in a thermal mixed state of the qubit ground state and the qubit metastable state. The quantum system, after subsequently decaying from the third quantum state to a fourth quantum state that is a composite of the qubit metastable state and the dissipater ground state, is in an approximately pure quantum state.

(B15) In any one of the methods denoted B1 to B14, the qubit metastable state may have a significant thermal occupation prior to said exciting.

(B16) In any one of the methods denoted B1 to B15, the method may further include cryogenically cooling the quantum system such that the temperature of the thermal bath surrounding the quantum system is greater than or equal to the qubit transition frequency.

(C1) A method for measuring a qubit state of a quantum system comprising a qubit coupled to a resonator includes coupling a first quantum state of the quantum system to a second quantum state of the quantum system. The qubit has a qubit ground state, a qubit metastable state, a first qubit excited state, and a second qubit excited state lying above the first qubit excited state. The qubit state is a linear superposition of the qubit ground state and the qubit metastable state, the first quantum state is a composite of the qubit metastable state and a resonator ground state of the resonator, and the second quantum state is a composite of the first qubit excited state and the resonator ground state. The method also includes dispersively reading the qubit state with the resonator. A resonant frequency of the resonator is greater than a transition frequency between the qubit metastable state and the first qubit excited state.

(C2) In the method denoted C1, the qubit may be a flux qubit.

(C3) In the method denoted C2, the flux qubit may be a fluxonium qubit.

(C4) In either one of the methods denoted C2 and C3, the flux qubit may be a heavy fluxonium qubit.

(C5) In any one of the methods denoted C2 to C4, the qubit ground state and the qubit metastable state may be connected via a fluxon-like transition, the qubit ground state and the second qubit excited state may be connected via a plasmon-like transition, and the qubit metastable state and the first qubit excited state may be connected via a plasmon-like transition.

(C6) In any one of the methods denoted C2 to C5, the method may further include threading the flux qubit with magnetic flux to form the qubit ground state, the qubit metastable state, the first qubit excited state, and the second qubit excited state.

(C7) In the method denoted C6, the magnetic flux may be one-half of a superconducting magnetic flux quantum.

(C8) In any one of the methods denoted C2 to C7, a qubit transition frequency between the qubit ground state and the qubit metastable state may be less than a temperature of a thermal bath surrounding the quantum system.

(C9) In any one of the methods denoted C2 to C8, said coupling may include applying a pi pulse.

(C10) In the method denoted C9, a frequency of the pi pulse may be resonant with a transition between the first and second quantum states.

(C11) In any one of the methods denoted C2 to C10, the method may further include preparing, prior to said coupling and said dispersively reading, the quantum system such that the qubit is in the qubit state.

(D1) A method for measuring a qubit state of a quantum system comprising a qubit coupled to a resonator includes coupling a first quantum state of the quantum system to a second quantum state of the quantum system. The qubit has a qubit ground state, a qubit metastable state, a first qubit excited state, and a second qubit excited state lying above the first qubit excited state. The qubit state is a linear superposition of the qubit ground state and the qubit metastable state, the first quantum state is a composite of the qubit ground state and a resonator ground state of the resonator, and the second quantum state is a composite of the second qubit excited state and the resonator ground state. The method also includes dispersively reading the qubit state with the resonator. A resonant frequency of the resonator is greater than a transition frequency between the qubit ground state and the second qubit excited state.

(D2) In the method denoted D1, the qubit may be a flux qubit.

(D3) In the method denoted D2, the flux qubit may be a fluxonium qubit.

(D4) In either one of the methods denoted D2 and D3, the flux qubit may be a heavy fluxonium qubit.

(D5) In any one of the methods denoted D2 to D4, the qubit ground state and the qubit metastable state may be connected via a fluxon-like transition, the qubit ground state and the second qubit excited state may be connected via a plasmon-like transition, and the qubit metastable state and the first qubit excited state may be connected via a plasmon-like transition.

(D6) In any one of the methods denoted D2 to D5, the method may further include threading the flux qubit with magnetic flux to form the qubit ground state, the qubit metastable state, the first qubit excited state, and the second qubit excited state.

(D7) In the method denoted D6, the magnetic flux may be one-half of a superconducting magnetic flux quantum.

(D8) In any one of the methods denoted D1 to D7, a qubit transition frequency between the qubit ground state and the qubit metastable state may be less than a temperature of a thermal bath surrounding the quantum system.

(D9) In any one of the methods denoted D1 to D8, said coupling may include applying a pi pulse.

(D10) In the method denoted D9, a frequency of the pi pulse may be resonant with a transition between the first and second quantum states.

(D11) In any one of the methods denoted D1 to D10, the method may further include preparing, prior to said coupling and said dispersively reading, the quantum system such that the qubit is in the qubit state.

(E1) A method for rotating a flux qubit in a linear superposition of first and second quantum-computational states includes threading the flux qubit with a magnetic flux at a nominal value such that the first and second quantum-computational states are separated by a nominal energy splitting. The linear superposition may be represented as a Bloch vector on a Bloch sphere. The method includes applying a first pulse to the flux qubit by momentarily deviating the magnetic flux away from the nominal value to rotate the Bloch vector about an x axis of the Bloch sphere.

(E2) In the method denoted E1, the first pulse may rotate the Bloch vector about the x axis by a first angle, and about a z axis of the Bloch sphere.

(E3) In either one of the methods denoted E1 and E2, a duration of the first pulse may be less than two periods of the energy splitting.

(E4) In any one of the methods denoted E1 to E3, the first and second quantum-computational states may be separated by a maximum energy splitting occurring at a peak of the first pulse, and an amplitude of the first pulse may be selected such that the maximum energy splitting is at least twice the nominal energy splitting.

(E5) In any one of the methods denoted E1 to E4, the nominal value of the magnetic flux may be one-half of a superconducting magnetic flux quantum, wherein the nominal energy splitting is equal to a Larmor frequency of the flux qubit.

(E6) In any one of the methods denoted E1 to E5, said applying the first pulse may rotate the Bloch vector about the x axis of the Bloch sphere by a first angle. The method may further include idling, after said applying the first pulse, with the magnetic flux at the nominal value to rotate the Bloch vector by a second angle about a z axis of the Bloch sphere. The method may also include applying, after said idling, a second pulse that rotates the Bloch vector by the negative of the first angle about the x axis of the Bloch sphere.

(E7) In the method denoted E6, an area of the first pulse and an area of second pulse may add to zero.

(E8) In either one of the methods denoted E6 and E7, a duration of the first pulse may equal a duration of the second pulse.

(E9) In any one of the methods denoted E6 to E8, the first and second pulses may deviate the magnetic flux away from the nominal value in opposite directions.

(E10) In any one of the methods denoted E6 to E9, a duration of each of the first and second pulses may be shorter than a duration of said idling.

(E11) In any one of the methods denoted E6 to E10, said applying the first pulse may additionally rotate the Bloch vector by the first angle about the z axis of the Bloch sphere. Said applying the second pulse may additionally rotate the Bloch vector by the first angle about the z axis of the Bloch sphere.

(E12) In any one of the methods denoted E6 to E11, the first pulse, the second pulse, and a duration of said idling may be configured such that the Bloch vector rotates about a y axis of the Bloch sphere by either positive ninety degrees or negative ninety degrees.

(E13) In any one of the methods denoted E1 to E12, the flux qubit may be a fluxonium qubit.

(E14) In any one of the methods denoted E1 to E13, the flux qubit may be a heavy fluxonium qubit.

(F1) A method for rotating a flux qubit by an angle includes threading the flux qubit with a magnetic flux at a nominal value such that first and second quantum-computational states of the flux qubit are separated by a nominal energy splitting. The flux qubit is in a superposition of the first and second quantum-computational states, and the linear superposition is represented as a Bloch vector on a Bloch sphere. The method also includes applying a first pulse to the flux qubit by momentarily deviating the magnetic flux away from the nominal value to rotate the Bloch vector by negative ninety degrees about a y axis of the Bloch sphere. The method also includes idling, after said applying the first pulse, the magnetic flux at the nominal value to rotate the Bloch vector by the angle about a z axis of the Bloch sphere. The method also includes applying, after said idling, a second pulse to the flux qubit to rotate the Bloch vector by positive ninety degrees about the y axis of the Bloch sphere. The Bloch vector is rotated by the angle about an x axis of the Bloch sphere.

(F2) In the method denoted F1, the flux qubit may be a fluxonium qubit.

(F3) In either one of the methods denoted F1, the flux qubit may be a heavy fluxonium qubit.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A method for initializing a quantum system formed from a qubit coupled to an energy dissipater, the qubit having a qubit ground state, a qubit metastable state, a first qubit excited state having a first excited-state energy, and a second qubit excited state having a second qubit-excited energy that is greater than the first excited-state energy, said method comprising:

exciting the quantum system from a first quantum state to a second quantum state by resonantly driving the quantum system with a first oscillating electromagnetic field, the first quantum state being a composite of the qubit ground state and a dissipater ground state of the energy dissipater, the second quantum state being a composite of the second qubit excited state and the dissipater ground state; and coupling the quantum system from the second quantum state to a third quantum state by resonantly driving the quantum system with a second oscillating electromagnetic field, the third quantum state being a composite of the qubit metastable state and a dissipater excited state of the energy dissipater;

wherein the quantum system decays from the third quantum state to a fourth quantum state that is a composite of the qubit metastable state and the dissipater ground state.

2. The method of claim 1, the qubit being a flux qubit.

3. The method of claim 2, the flux qubit being a fluxonium qubit.

4. The method of claim 2, the flux qubit being a heavy fluxonium qubit.

5. The method of claim 2, wherein:

the qubit ground state and the qubit metastable state are connected via a fluxon-like transition;

the qubit ground state and the second qubit excited state are connected via a plasmon-like transition; and the qubit metastable state and the first qubit excited state are connected via a plasmon-like transition.

6. The method of claim 2, further comprising threading the flux qubit with magnetic flux to form the qubit ground state, the qubit metastable state, the first qubit excited state, and the second qubit excited state.

7. The method of claim 6, the magnetic flux being one-half of a superconducting magnetic flux quantum.

8. The method of claim 6, wherein said threading, said exciting, and said coupling occur simultaneously.

9. The method of claim 8, wherein a duration of said threading, said exciting, and said coupling is less than both a qubit relaxation time and a qubit dephasing time of the flux qubit.

10. The method of claim 1, the energy dissipater being a resonator or a transmission line.

11. The method of claim 1, wherein:

said exciting includes driving the quantum system with a first microwave field having a first frequency that is resonant with a first transition between the first and second quantum states; and said coupling includes driving the quantum system with a second microwave field having a second frequency that is resonant with a second transition between the second and third quantum states.

12. The method of claim 1, further comprising transferring, with a pi pulse, the quantum system from the fourth quantum state to the first quantum state.

13. The method of claim 12, wherein a frequency of the pi pulse is resonant with a transition between the fourth and first quantum states.

14. The method of claim 1, further comprising preparing, prior to said exciting and said coupling, the quantum system such that the qubit is in a thermal mixed state of the qubit ground state and the qubit metastable state;

wherein the quantum system, after subsequently decaying from the third quantum state to the fourth quantum state, is in an approximately pure quantum state.

15. The method of claim 1, wherein a qubit transition frequency between the qubit ground state and the qubit metastable state is less than or equal to a temperature of a thermal bath surrounding the quantum system.

16. The method of claim 1, wherein a qubit transition frequency $\omega$ between the qubit ground state and the qubit metastable state is less than $k_B T/h$, where $K_B$ is Boltzmann's constant, T is the temperature of an environment within which the quantum system is located, and $\hbar$ is Planck's constant divided by $2\pi$.

17. The method of claim 1, further comprising cryogenically cooling the quantum system such that a temperature of a thermal bath surrounding the quantum system is greater than or equal to a qubit transition frequency between the qubit ground state and the qubit metastable state.

\* \* \* \* \*